(12) United States Patent
Pauritsch et al.

(10) Patent No.: US 8,710,761 B2
(45) Date of Patent: Apr. 29, 2014

(54) CIRCUIT ARRANGEMENT FOR A PIEZO TRANSFORMER, AND METHOD THEREFOR

(75) Inventors: Manfred Pauritsch, Graz (AT); Peter Trattler, Graz (AT)

(73) Assignee: AMS AG, Unterpremstaetten (AU)

( * ) Notice: Subject to any disclaimer, the term of this patent is extended or adjusted under 35 U.S.C. 154(b) by 162 days.

(21) Appl. No.: 13/310,405

(22) Filed: Dec. 2, 2011

(65) Prior Publication Data

US 2012/0200233 A1   Aug. 9, 2012

Related U.S. Application Data

(63) Continuation of application No. PCT/EP2010/056369, filed on May 10, 2010.

(30) Foreign Application Priority Data

Jun. 2, 2009 (DE) .......................... 10 2009 023 505

(51) Int. Cl.
*H01L 41/107* (2006.01)

(52) U.S. Cl.
USPC ........ 315/279; 315/209 R; 315/224; 310/318; 310/311; 310/366; 310/359

(58) Field of Classification Search
USPC .................. 315/279, 219, 220, 224, 209 PZ; 310/311, 316.01, 318, 359, 366
See application file for complete search history.

(56) References Cited

U.S. PATENT DOCUMENTS

| | | | |
|---|---|---|---|
| 5,854,543 A | 12/1998 | Satoh et al. | |
| 5,886,477 A | 3/1999 | Honbo et al. | |
| 6,044,003 A * | 3/2000 | Toshinari et al. | 363/97 |
| 6,144,139 A | 11/2000 | Noma et al. | |
| 6,184,631 B1 * | 2/2001 | Noma et al. | 315/224 |
| 6,188,163 B1 * | 2/2001 | Danov | 310/366 |
| 6,239,558 B1 | 5/2001 | Fujimura et al. | |
| 6,278,227 B1 * | 8/2001 | Katsuno et al. | 310/359 |
| 6,331,748 B1 | 12/2001 | Hong | |
| 6,348,755 B1 * | 2/2002 | Shimamura et al. | 310/318 |
| 6,400,096 B1 | 6/2002 | Wells et al. | |
| 6,720,705 B2 * | 4/2004 | Nakatsuka et al. | 310/316.01 |
| 6,911,787 B2 * | 6/2005 | Takeda et al. | 315/209 PZ |
| 7,256,530 B2 * | 8/2007 | Takama | 310/316.01 |
| 7,294,972 B2 | 11/2007 | Chou et al. | |
| 7,825,605 B2 * | 11/2010 | Zhang et al. | 315/224 |
| 2008/0266004 A1 | 10/2008 | Denier et al. | |

FOREIGN PATENT DOCUMENTS

JP          55098881           7/1980

OTHER PUBLICATIONS

"Multi-Topology Piezoelectric Transformer Controller", Texas Instruments Inc., Jan. 2002.

* cited by examiner

*Primary Examiner* — Vibol Tan
(74) *Attorney, Agent, or Firm* — McDermott Will & Emery LLP

(57) ABSTRACT

The invention relates to a circuit arrangement (20) for a piezo transformer (22) comprising a driver circuit (23), to which the piezo transformer (22) can be connected, and a current sensor (21) for the determining an incoming power signal (IM), which is subject to an incoming current (IE) flowing through the piezo transformer (22). The invention further relates to the circuit arrangement (20) of a control unit (24) for providing a control signal (ST), which is subject the incoming power signal (IM); and an oscillator (25) having an oscillator output (43) for emitting an oscillator signal (SO) to a driver signal input (44) of the driver circuit (23) subject to the control signal (ST).

13 Claims, 9 Drawing Sheets

CIRCUIT ARRANGEMENT FOR A PIEZO TRANSFORMER, AND METHOD THEREFOR

RELATED APPLICATIONS

This application is a continuation application under 37 C.F.R. 1.53(b) of pending International Application No. PCT/EP2010/056369 filed May 10, 2010. Priority is hereby claimed of German application no. 10 2009 023 505.1 filed Jun. 2, 2009. The entire content of both applications is hereby incorporated by reference.

FIELD OF THE INVENTION

The invention relates to a circuit arrangement for a piezo transformer and a method to control a piezo transformer.

BACKGROUND OF THE INVENTION

Piezo transformers are used to convert voltages. Piezo transformers, called piezoelectric transformers or piezo transformers in English, have a primary side, to which a voltage or a current is supplied, and a secondary side, on which a current or a voltage is accessible.

Document U.S. Pat. No. 6,400,096 B1 describes a control circuit for a piezo transformer, which makes available a voltage for a fluorescent light source. For control purposes, a signal is accessible on the secondary side of the piezo transformer and thus, on the high voltage side.

SUMMARY OF THE INVENTION

An object of the invention is to make available a circuit arrangement for a piezo transformer and a method for the control of a piezo transformer, in which a control with a primary-side variable is carried out.

In one embodiment, a circuit arrangement for a piezo transformer comprises a driver circuit, a current sensor, a control unit, and an oscillator. The piezo transformer can be connected to the driver circuit. A current sensor is provided to determine an incoming current signal. The incoming current signal depends on an incoming current, flowing through the piezo transformer. A control unit is designed to make available a control signal as a function of the incoming current signal. An oscillator signal, as a function of the control signal, is emitted on an oscillator output of the oscillator. The driver circuit has a driver signal input. The oscillator signal is supplied to the driver signal input.

Advantageously, the incoming current flows through a primary side of the piezo transformer, so that the current sensor is placed on the primary side. The current sensor is advantageously placed in the low-volt area of the primary side and not in the high-volt area of the secondary side of the piezo transformer. The incoming current signal can be proportional to the incoming current.

In an embodiment, a primary side voltage imparts mechanical oscillations into the piezo transformer. On the secondary side of the piezo transformer, the mechanical oscillations are transformed into a secondary side voltage. The piezo transformer can have a multilayer structure, as it is called in English. The number of layers can determine the transformation ratio of the secondary side voltage to the primary side voltage.

In one embodiment, the control unit emits the control signal so that the incoming current signal is smaller than or equal to a predetermined current value. In this way, one can avoid having too high a load of a supply source for the circuit arrangement. Disturbances and influences on another circuit block, provided by the supply source, can thus be reduced.

In one embodiment, the circuit arrangement comprises the supply source. The current sensor can be placed between the supply source and the driver circuit. Alternatively, the current sensor can be placed between the driver circuit and the piezo transformer. In turn, the current sensor can alternatively be placed between the piezo transformer and a reference potential connection or between the driver circuit and the reference potential connection. The current sensor can be placed in a line that leads to the first or to the second primary connection.

The current sensor can comprise a Hall element. The Hall element and a line through which the incoming current flows can be placed in such a way relative to one another that the incoming current produces a magnetic field, which can be measured by the Hall element. The incoming current signal can be a Hall voltage of the Hall element. Advantageously, a contactless measurement of the incoming current is made possible in this way.

In an alternative embodiment, the current sensor is designed as a current transformer.

In a preferred embodiment, the current sensor comprises a measuring resistor. The measuring resistor can be connected in series to the primary side of the piezo transformer. The incoming current signal can be a voltage drop across the measuring resistor. A particularly simple determination is possible by means of the measuring resistor.

In one embodiment, the driver circuit comprises a first transistor and a first measuring transistor. A series circuit comprising the first measuring transistor and the measuring resistor is connected parallel to the first transistor. A driver control of the driver circuit can be connected on the output side to a control connection of the first transistor and a control connection of the first measuring transistor. The control connection of the first transistor can be connected directly to the control connection of the first measuring transistor. The first transistor connects the first primary connection to the reference potential connection. The first transistor and the first measuring transistor are of the same line type. A current driver capacity of the first transistor is larger by the factor n than a current driver capacity of the first measuring transistor. Advantageously, the main fraction of the incoming current can thus flow via the first transistor and a smaller fraction of the incoming current via the measuring resistor and the first measuring transistor. The voltage drop across the measuring resistor is used as the incoming current signal. Since the factor n and a resistance value RS1 of the measuring resistor are known, the incoming current signal is approximately produced in accordance with the following equation:

$$IM = \frac{IE \cdot RS1}{n+1},$$

wherein IM is a value of the incoming current signal; IE a value of the incoming current; and n the factor by which the current-carrying capacity of the first transistor is greater than the current-carrying capacity of the first measuring transistor.

In one embodiment, the control unit comprises a comparator with a first and a second comparator input and a comparator output. The incoming current signal is supplied to the first comparator input. The predetermined current value is supplied to the second comparator input. The predetermined current value and the incoming current signal can be implemented as voltages. The comparator output is coupled to a first control output of the control unit. Advantageously, the comparator makes available on the comparator output a comparator signal with a first value if the incoming current signal is smaller than or equal to the predetermined current value, and a comparator signal with a second value if the incoming current signal is greater than the specified current value.

In one embodiment, a voltage transformer comprises the circuit arrangement and the piezo transformer. The piezo transformer is connected to the driver circuit. In one embodiment, a coil is connected between the driver circuit and the first primary connection or between the driver circuit and the second primary connection. Advantageously, the coil and the piezo transformer form an oscillating circuit. The oscillating circuit can be implemented as a series oscillating circuit. The energy utilization with the transformation of the supply voltage into the secondary side voltage between the first and the second secondary connection can be increased by means of the series oscillating circuit.

In one embodiment, the control unit has a voltage input which is coupled to the first secondary connection of the piezo transformer. The control unit can emit the control signal as a function of a comparison of a signal on the voltage input and a predetermined voltage value. The signal on the voltage input can represent a voltage which is made accessible on the secondary side of the piezo transformer, in particular, an output voltage. The predetermined voltage value can be a theoretical value of the voltage made accessible on the secondary side. Advantageously, therefore, the driver circuit can be set inactive if the voltage made accessible on the secondary side is greater than the predetermined voltage value.

The voltage transformer can have an output capacitor. A second electrode of the output capacitor can be connected to the first secondary connection. A first electrode of the output capacitor can be coupled to the second secondary connection of the piezo transformer via a first diode. A second diode can be connected between the first and the second secondary connection. The output voltage can be between the first and the second electrode of the output capacitor. The voltage transformer can be designed to make available the output voltage with a high value. The output voltage can be greater than 100 volts. Preferably, the output voltage can be greater than 300 volts.

In one embodiment, a lighting arrangement comprises the voltage transformer and a light source. The light source is coupled to the output capacitor. The light source can be a xenon light source. The light source can be designed to emit a flash.

In one embodiment, a method for the control of a piezo transformer comprises the making available of incoming current for the piezo transformer. An incoming current signal is generated as a function of the incoming current. A control signal is made available as a function of the incoming current signal. An oscillator signal is generated as a function of the control signal. Furthermore, the piezo transformer is controlled as a function of the oscillator signal.

Thus, the piezo transformer is advantageously controlled as a function of the incoming current. The incoming current can flow through a primary side of the piezo transformer. Therefore, in the control of the arrangement, the value of the incoming current is taken into consideration. The incoming current can be supplied to a first primary connection of the piezo transformer. The incoming current signal is advantageously produced on the primary side of the piezo transformer, so that the tapping takes place on a low voltage potential of the primary side and not on a high voltage potential of the secondary side.

In one embodiment, the control signal is emitted in such a way that the incoming current signal is smaller than or equal to a predetermined current value. Advantageously, an overload of a supply source, which makes available the incoming current, can be avoided. By monitoring the incoming current, it is possible to reduce a thermal loading of the circuit arrangement.

In one embodiment, a frequency of the oscillator signal is established in such a way that the incoming current signal is smaller than or equal to the predetermined current value. Alternatively, the pulse duty factor of the oscillator signal is controlled in such a manner that the incoming current signal is smaller than or equal to the predetermined current value. In turn, alternatively, the frequency and the pulse duty factor of the oscillator signal are established in such a way that the incoming current signal is smaller than or equal to the predetermined current value. In one embodiment, the frequency of the oscillator signal and/or the pulse duty factor of the oscillator signal depend on the control signal.

In one refinement, the distance of the frequency to a resonance frequency of the piezo transformer is increased if the incoming current signal is greater than the predetermined current value. The distance of the frequency to the resonance frequency of the piezo transformer is reduced if the incoming current signal is smaller than the predetermined current value.

In one refinement, the frequency of the oscillator signal is adjusted to the resonance frequency of the piezo transformer. The pulse duty factor of the oscillator signal is adjusted in such a way that the incoming current is smaller than or equal to the predetermined current value.

BRIEF DESCRIPTION OF THE DRAWINGS

The invention is explained in more detail below with several embodiment examples and the aid of the figures. Components and circuit elements that have the same function or effect have the same reference symbols. To the extent that circuit parts or components correspond in their function, their description is not repeated in each of the following figures. The figures show the following.

BRIEF DESCRIPTION OF THE DRAWINGS

Figure 1A:
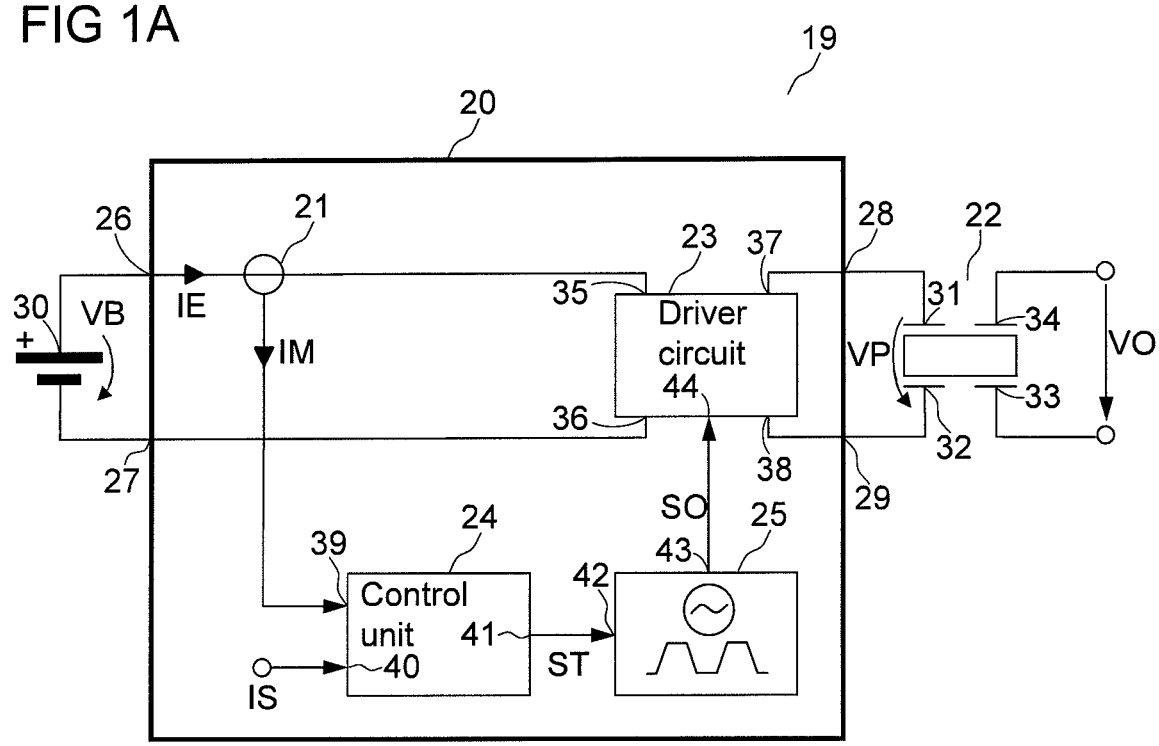
FIGS. 1A and 1B, examples of embodiments of a voltage transformer according to the invention.

FIG. 1A shows an example of an embodiment of a voltage transformer according to the invention. The voltage transformer 19 comprises a circuit arrangement 20 and a piezo transformer 22. The circuit arrangement 20 has a current sensor 21, a driver circuit 23, a control unit 24, and an oscillator 25. The circuit arrangement 20 is integrated in a semiconductor body. The semiconductor body comprises the circuit arrangement 20. The circuit arrangement 20 has a supply voltage connection 26, a reference potential connection 27, and a first and a second output 28, 29. A supply source 30 is located between the supply voltage connection 26 and the reference potential connection 27. The supply source 30 is constructed as a battery. The piezo transformer 22 has a first and a second primary connection 31, 32, and a first and a second secondary connection 33, 34. The first output 28 is connected to the first primary connection 31. The second output 29 is connected to the second primary connection 32. On the input side, the driver circuit 23 is connected to the supply voltage connection 26 and to the reference potential connection 27 at a first and a second driver input 35, 36. On the output side, the driver circuit 23 is connected to the first and the second output 28, 29 of the circuit arrangement 21 on a first and a second driver output 37, 38.

The current sensor 21 is located between the supply voltage connection 26 and the first driver input 35 of the driver circuit 23. An output of the current sensor 23 is connected to a first control input 39 of the control unit 24. The control unit 24 has a second control input 40 and a first control output 41. The first control output 41 is connected to an oscillator input 42 of the oscillator 25. An oscillator output 43 of the oscillator 25 is connected to a driver signal input 44 of the driver circuit 23.

A supply voltage VB is made available by the supply source 30. The supply voltage VB is tapped between the supply voltage connection 26 and the reference potential connection 27. The supply voltage VB is supplied to the first and the second input 35, 36 of the driver circuit 23. An incoming current IE flows between the supply voltage connection 26 and the first input 35 of the driver circuit 23. The current sensor 21 measures the incoming current IE and generates an incoming current signal IM as a function of the incoming current IE. The incoming current signal IM is supplied to the first control unit 39 of the control unit 24. A predeterminable current value IS is supplied to the second control input 40 of the control unit 24. The control unit 24 emits a control signal ST at the output 41. The control signal ST is produced by the control unit 24 as a function of the incoming current signal IM and the predetermined current value IS. The control signal ST is supplied to the oscillator input 42. The oscillator 25 emits an oscillator signal SO at the oscillator output 43. The oscillator signal SO is produced by the oscillator 25 as a function of the control signal ST. The oscillator signal SO is supplied to the driver signal input 44. The driver circuit 22 generates a primary side voltage VP as a function of the oscillator signal SO. The primary side voltage VP is supplied to the piezo transformer 22. The primary side voltage VP is between the first and the second driver output 37, 38 and thus between the first and the second primary connection 31, 32. A secondary side voltage VO is tapped between the first and the second secondary connection 33, 34.

Advantageously, a regulation takes place in the circuit arrangement 20 by the incoming current signal IM, which can be tapped on the primary side of the piezo transformer 22.

Figure 1B:
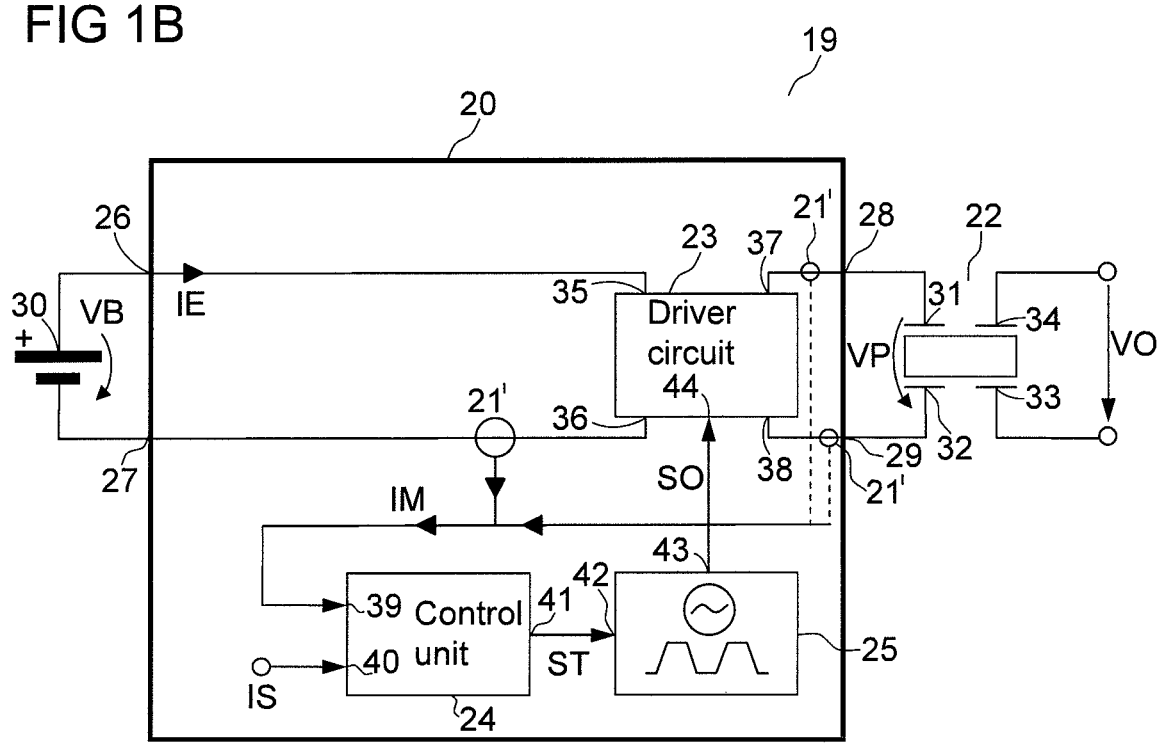

FIG. 1B shows another example of an embodiment of a voltage transformer according to the invention, which is a further development of the voltage transformer shown in FIG. 1A. The current sensor 21' is located between the driver circuit 23 and the reference potential connection 27 in accordance with FIG. 1B. Thus, the current sensor 21' is located between the second driver input 36 of the driver circuit 23 and the reference potential connection 27. In this way, the incoming current signal IM can be made available as a voltage signal, which is referred to the potential of the reference potential connection 27.

In an alternative embodiment, the current sensor 21' can be located between the driver circuit 23 and the piezo transformer 22. The current sensor 21' can be located between the first driver output 37 and the first output 28 of the circuit arrangement 20 or between the second driver output 38 and the second output 29 of the circuit arrangement 20.

Figure 2A:
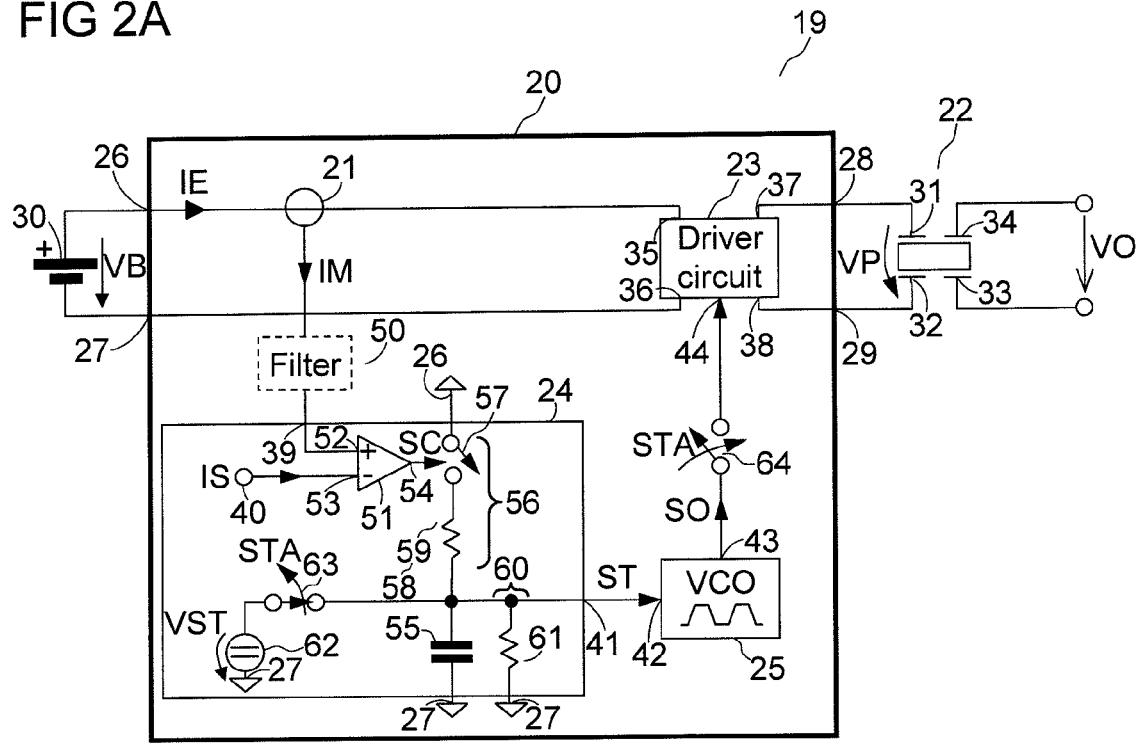
FIGS. 2A and 2B, another example of an embodiment of a voltage transformer, according to the invention, and a representation of the impedance of the piezo transformer as a function of a frequency.

FIG. 2A shows another example of the embodiment of a voltage transformer according to the invention. FIG. 2A shows a refinement of the voltage transformer 20 depicted in FIGS. 1A and 1B. The oscillator 25 is implemented as a voltage-controlled oscillator abbreviated as VCO. The control unit 24 comprises a comparator 51 with a first and a second comparator input 52, 53. The first comparator input 52 is designed as a noninverting input and the second comparator input 53 as an inverting input. The first comparator input 52 is connected to the first control input 39. The control unit 24 has, moreover, a control capacitor 55. A first electrode of the control capacitor 55 is connected to the first control output 41 of the control unit 24. A second electrode of the control capacitor 55 is connected to the reference potential connection 27. Furthermore, the control unit 24 has a first current source 56. A comparator output 54 of the comparator 51 is connected to a control input of the first current source 56. The first current source 56 is implemented as a connected resistor. The first current source 56 connects the supply voltage connection 26 to the first electrode of the control capacitor 55. The first current source 56 comprises a current source switch 57 and a current source circuit 58, which are placed serially relative to one another. The current source circuit 58 is implemented as a first current source resistor 59. The comparator output 54 is connected to a control connection of the current source switch 57.

A second current source 60 is located between the first electrode of the control capacitor 55 and the reference potential connection 27. The second current source 60 comprises a second current source resistor 61. Moreover, the control unit 24 comprises a starting voltage source 62 and a voltage source switch 63. A serial connection of the starting voltage source 62 and the voltage source switch 63 is located between the first electrode of the control capacitor 55 and the reference potential connection 27. Furthermore, the circuit arrangement 20 has an oscillator switch 64, which connects the oscillator output 43 to the drive input 44.

The incoming current signal IM is supplied to the first comparator input 52. The predetermined current value IS is supplied to the second comparator input 53. If the incoming current signal IM is greater than the predetermined current value IS, then a comparator outgoing signal SC has a value with which the first current source 56 is set active. The current source switch 57 is closed for this purpose. The capacitor 55 is charged by means of the first current source 56. The control signal ST is implemented as a voltage signal. The control signal ST drops across the control capacitor 55. The control signal ST is supplied to the control input 42 of the oscillator 25. Via the second current source 60, a current flows from the first electrode of the control capacitor 55 to the reference potential connection 27. Thus, by means of the second current source 60, it is possible to reduce the control voltage ST.

If the incoming current signal IM is smaller than or equal to the predetermined current value IS, then the first current source 56 is set inactive. The current source switch 57 is in an opened state for the purpose. In this operating state, the control capacitor 55 is discharged via the second current source 60. The starting voltage source 62 generates a starting voltage VST. When no secondary voltage VO is to be generated, voltage source switch 63 and oscillator switch 64 are open. In a starting phase, voltage source switch 63 and oscillator switch 64 are closed. In particular, the voltage source switch 63 is closed, so that the control capacitor 55 is charged to the starting voltage VST. The control voltage ST thus assumes the value of the starting voltage VST. The starting voltage source 62 and the voltage source switch 63 ensure that after the start of the operation of the circuit arrangement 20, the control signal ST with the starting value VST is made available, and the oscillator 25 emits the oscillator signal SO with a starting frequency f1. After the start, the oscillator switch 64 is closed, so that the oscillator signal SO is supplied to the driver signal input 44. After ending the starting phase, the voltage source switch 63 is opened. The other regulation of the control signal ST thus takes place via the comparator 51 and the first or the second current source 56, 60. An additional explanation of the manner of functioning of the voltage transformer in accordance with FIG. 2A is given with the aid of FIG. 2B.

In another embodiment, a starting signal STA is supplied to the control terminals of the voltage source switch 63 and the oscillator switch 64. When no secondary side voltage VO has to be generated, the voltage source switch 63 is closed and the oscillator switch 64 is opened by the starting signal STA. Thus, the starting voltage VST drops across the control capacitor 55. At start of operation, the voltage source switch 63 will be opened and the oscillator switch 64 will be closed by the starting signal STA. Thus, the oscillator signal SO with the starting frequency f1 is initially provided to the driver circuit 23. Then, the feedback loop comprising the current sensor 21 and the control unit 24 changes the oscillator frequency fO of the oscillator signal SO.

The control unit 24 can be advantageously implemented with a small number of components.

In an alternative embodiment, the circuit arrangement 20 comprises a filter 50, which couples the current sensor 21 to the first input 39 of the control unit 24. The filter 50 is implemented as a low-pass filter. The incoming current signal IM is filtered by means of the filter 50, so that a filtered incoming current signal is applied on the first control input 39.

In an alternative embodiment that is not shown, the control unit comprises an amplifier. The amplifier is implemented as a transconductance amplifier, operational transconductance amplifier in English. A first input of the amplifier is connected with the first control input 39. The predetermined current value IS is supplied to a second input of the amplifier. The amplifier connects the supply voltage connection 26 to the first electrode of the capacitor 55. The amplifier is thus used instead of the comparator 51 and the first current source 56. The amplifier advantageously brings about a finely adjusted charging of the control capacitor 55.

Figure 2B:
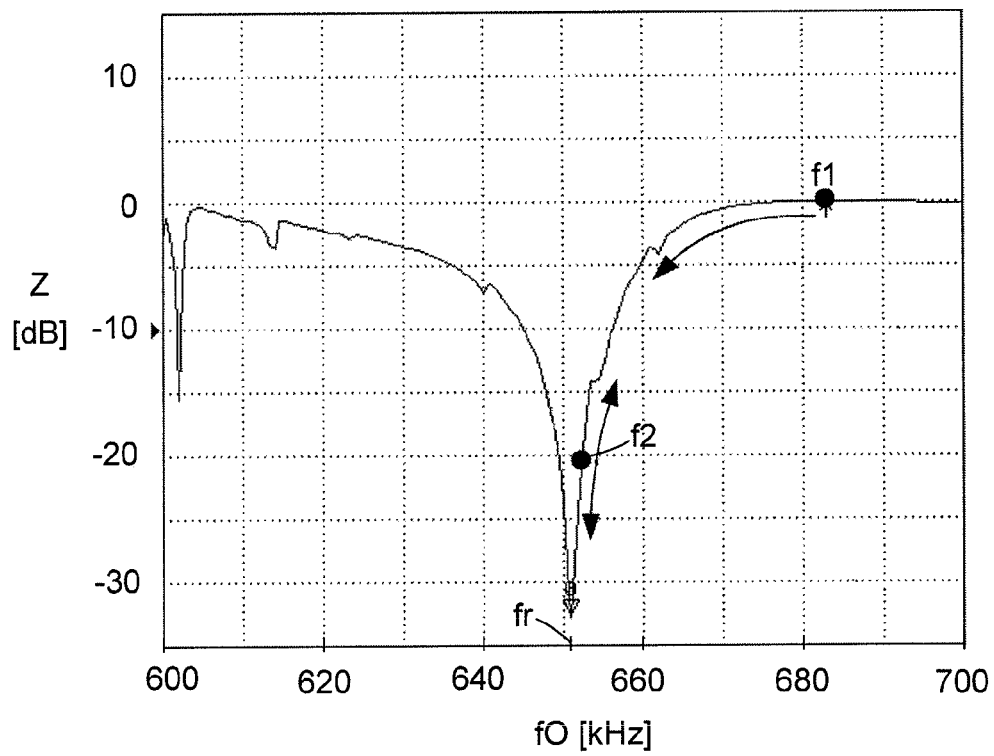

FIG. 2B shows an input impedance of the piezo transformer 22 as a function of an oscillator frequency fO of the oscillator signal SO. For the measurement of the impedance, a test signal with 0 dBm—that is 1 mW—was used. With a resonance frequency fr, a series resonance appears. The resonance frequency fr has, for example, the value 650 kHz. In operation, the piezo transformer 22 is operated with a starting frequency f1 after the start. The starting frequency f1 is established by means of the starting voltage source 62. The oscillator 25 makes available the starting frequency f1 if the starting voltage VST is applied at the control input of the oscillator 25. With the starting frequency f1, the incoming current signal IM is smaller than the predetermined current value IS. Therefore, the comparator outgoing signal SC switches the current source switch 57 into an open state. The capacitor 55 is discharged by means of the second current source 60 until the oscillator 25 makes available an oscillator signal SO with an operating point frequency f2 at which the incoming current signal IM is equal to the predetermined current value IS. If the incoming current signal IM is greater than the predetermined current value IS, then the comparator outgoing signal SC closes the current source switch 57 so that the control voltage ST rises.

Advantageously, the regulation makes it possible for the oscillator signal SO to be made available with the operating point frequency f2 at which the incoming current signal IM is approximately equal to the predetermined current value IS. Thus, at the operating point frequency f2, the desired operating point of the circuit arrangement 20 is attained. The operating point can be advantageously retained independent of load conditions, temperature, or fluctuations of the supply voltage VB. Spurious frequencies advantageously do not influence the operation of the circuit arrangement 20 since a phase relationship is not required between the signals.

Figure 3:
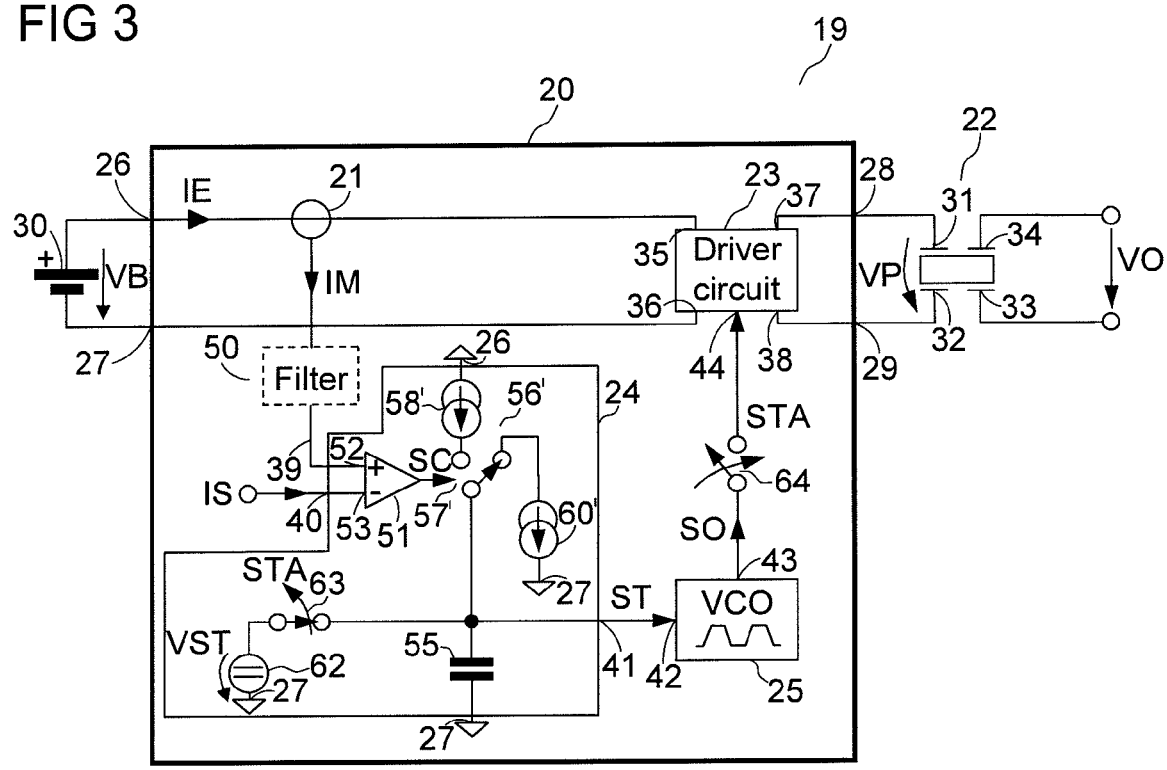
FIGS. 3, 4A, 4B, 5-8, other examples of embodiments of a voltage transformer, according to the invention.

FIG. 3 shows another embodiment example of a voltage transformer, which is a refinement of the embodiments shown in FIGS. 1A, 1B, and 2A. In accordance with FIG. 3, the control unit 24 comprises the control capacitor 55 and the first current source 56'. The first current source 56' has the current source circuit 58' and the current source switch 57'. The current source circuit 58' is thereby connected to the supply voltage connection 26 and the current source switch 57' to the first electrode of the control capacitor 55. The comparator 51 is connected to the control input of the current source switch 57' at the comparator output 54. The current source switch 5T is implemented as a changeover switch. The first input of the current source switch 57' is connected to the current source circuit 58' and the second input of the current source switch 57' to the second current source 60'. The second current source 60' connects the second input of the current source switch 57' to the reference potential connection 27. An output of the current source switch 57' is connected to the first electrode of the control capacitor 55.

As a function of the comparator outgoing signal SC, the first electrode of the control capacitor 55 is either connected to the first current source circuit 58' or the second current source 60'. If the incoming current signal IM is greater than the predetermined current value IS, then the current source switch 57' is switched in such a way that the electrode of the control capacitor 55 has a conductive connection to the first current source circuit 58'. If, on the other hand, the incoming current signal IM is smaller than the predetermined current value IS, then the current source switch 57' connects the second current source 60' conductively to the first electrode of the control capacitor 55.

The first current source circuit 58' and/or the second current source 60' can be implemented as resistors. Preferably, the first current source circuit 58' and the second current source 60' are respectively designed as a transistor circuit, so that the space requirement is less than with an implementation with resistors. Advantageously, the control unit 24 is free of resistors, since instead of resistors, switched current sources are used in the control unit 24.

In an alternative embodiment that is not shown in FIGS. 2A, 2B, and 3, a frequency below the resonance frequency fr of the piezo transformer 22 is selected as the starting frequency f1 for the oscillator 25. Proceeding from the starting frequency f1, the oscillator frequency fO is increased until an operating point frequency f2 that is smaller than the resonance frequency fr is attained. At the operating point frequency f2, the incoming current signal IM corresponds to the predetermined current value IS. In the alternative embodiment, the current source switch 57 is closed in accordance with FIG. 2A, if the incoming current signal IM is smaller than the predetermined current value IS, and is open, if the incoming current signal IM is greater than the predetermined current value IS. In FIG. 3, the first electrode of the control capacitor 55 is connected, in this case, to the first current source circuit 58' via the current source switch 57' if the incoming current signal IM is smaller than the predetermined current value IS, and connected to the second current source 60' if the incoming current signal IM is greater than the predetermined current value IS.

Figure 4A:
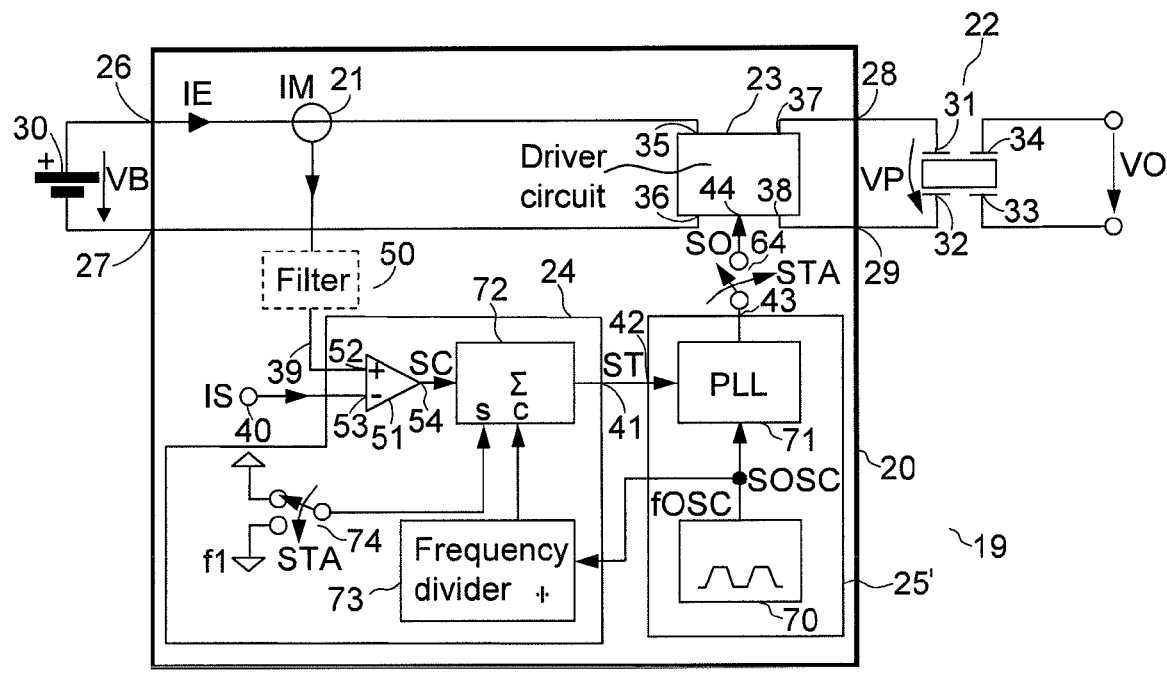

FIG. 4A shows another exemplified embodiment of a voltage transformer, which is a further development of the voltage transformer depicted in FIGS. 1-3. In accordance with FIG. 4a, the oscillator 25' comprises a frequency generator 70 and a phase-locked loop 71. The frequency generator 70 is implemented as an internal frequency generator. The output 41 of the control unit 24 is connected via the oscillator input 42 to a control input of the phase-locked loop 71. An output of the frequency generator 70 is connected to a cycle input of the phase-locked loop 71. An output of the phase-locked loop 71 is connected to the oscillator output 43. The oscillator output 43 is connected to the driver signal input 44 via the oscillator switch 64. The control unit 24 comprises the comparator 51 and a counter 72. The counter 72 is implemented as an upwards/downwards counter. The comparator output 54 is connected via the counter 72 to the output 41 of the control unit 24. A cycle input of the counter 72 is coupled to the output of the frequency generator 70. A frequency divider 73 couples the output of the frequency generator 70 to the cycle input of the counter 72.

Information regarding the starting frequency f1 is supplied to the counter 72 on a set input of the counter 72. The control unit 24 comprises to this end a starting switch 74. A value at which the circuit arrangement 20 is turned off is made available at the first input of the starting switch 74. The information regarding the starting frequency f1 is made available at the second input of the starting switch 74. The control signal ST is a signal on an output of the counter 72. The control signal ST is designed as a digital signal. The counter 72 makes available the control signal ST as a function of a comparison of the incoming current signal IM with the predetermined current value IS. The control signal ST is increased or decreased by the counter 72 as a function of the comparator outgoing signal SC. The frequency generator 70 produces a frequency signal SOSC with a normal frequency fOSC. The oscillator signal SO is made available as a function of the frequency signal SOSC and the control signal ST. The control signal ST influences the oscillator frequency fO via the phase-looped circuit 71. The counter 72 is used to establish the oscillator frequency fO. The control unit 24 can be advantageously implemented by means of digital circuits. A frequency search in the manner described with the FIGS. 2A, 2B, and 3 can be advantageously carried out.

Figure 4B:
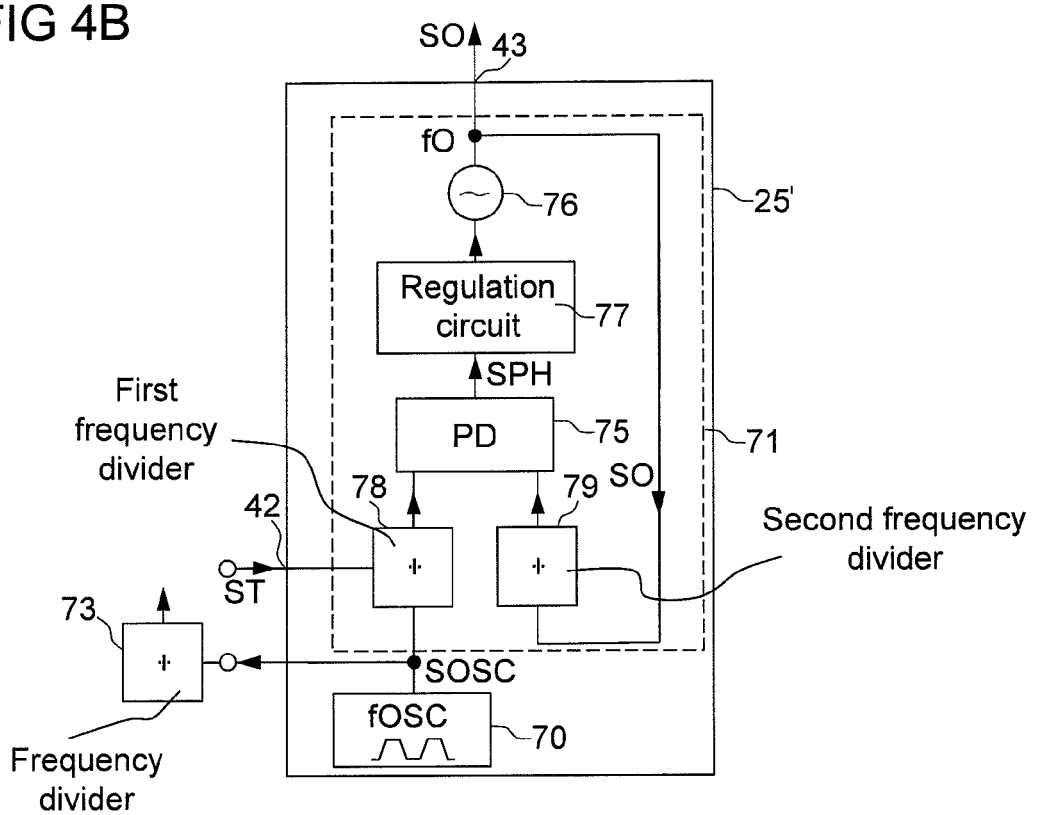

FIG. 4B shows an exemplified embodiment of an oscillator 25', which can be inserted, for example, into a circuit arrangement 20 in accordance with FIG. 4A. The oscillator 25' comprises the frequency generator 70 and the phase-locked loop 71. The phase-locked loop 71 comprises a phase detector 75 and a tracking oscillator 76. An output of the phase detector 75 is coupled to an input of the tracking oscillator 76. An output of the tracking oscillator 76 is connected to the oscillator output 43. The output of the phase detector 75 is connected via a regulation circuit 77 to the input of the tracking oscillator 76. The circuit 77 comprises a loop filter. In addition, the regulation circuit 77 can comprise a charge pump. The output of the phase detector 75 is thereby connected to the input of the tracking oscillator 76, via the loop filter and the charge pump. The tracking oscillator 76 is implemented as a voltage-controlled oscillator. The frequency generator 70 is connected to a first input of the phase detector 75 via a first frequency divider 78. The output of the tracking oscillator 76 is connected to a second input of the phase detector 75 via a second frequency divider 79. The oscillator input 42 is connected to a control input of the first frequency divider 78. The phase detector 75, the tracking oscillator 76, the regulation circuit 77, and the first and the second frequency dividers 78, 79 are implemented as analog circuits.

The frequency signal SOSC at the output of the frequency generator 70 is divided by means of the first frequency divider 78 and the divided signal is supplied to the first input of the phase detector 75. The tracking oscillator 76 generates the oscillator signal SO. The oscillator signal SO is divided by the second frequency divider 79, and the divided signal is supplied to the second input of the phase detector 75. The phase detector 75 compares the divided frequency signal at the first input with the divided oscillator signal at the second input and makes available a phase detector outgoing signal SPH as a function of the comparison. The phase detector outgoing signal SPH is supplied to the tracking oscillator 76 via the regulation circuit 77. The control signal ST is supplied to the control input of the first frequency divider 78. With the control signal ST, a first divider ratio n1 is established, which is implemented by the first frequency divider 78. Thus, by the establishing of the first divider ratio n1, the oscillator frequency fO of the oscillator signal SO is established. The oscillator frequency fO is produced, in accordance with the following equation:

$$fO = fOSC \cdot \frac{n2}{n1},$$

wherein fOSC is the frequency of the frequency signal SOSC and n2 is a second divider ratio of the second frequency divider 79. If the frequency signal SOSC has fluctuations, then the control signal ST is made available by means of the current sensor 21 and the control unit 24, in such a way that the oscillator frequency fO of the oscillator signal SO has approximately the value before the appearance of the fluctuations in the frequency signal SOSC.

In an alternative embodiment that is not shown, the phase detector 75, the tracking oscillator 76, the regulation circuit 77, and the first and the second frequency dividers 78, 79 are designed as digital circuits.

Alternatively, the oscillator input 42 is connected to the second frequency divider 79. The control signal ST is hereby supplied to the second frequency divider 79 and not the first frequency divider 78.

Figure 5:
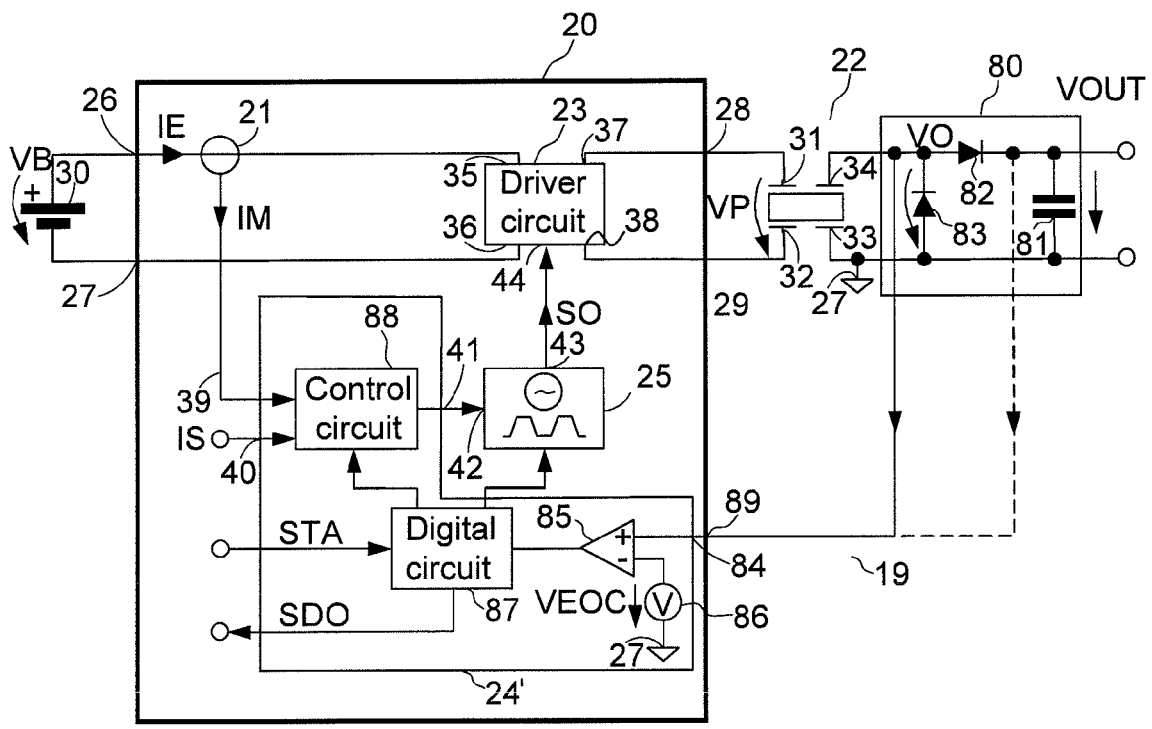

FIG. 5 shows another exemplified embodiment of a voltage transformer, which is a further development of the voltage transformer that is depicted in the FIGS. 1-3, 4A and 4B. The voltage transformer 19 comprises an output circuit 80. The output circuit 80 is connected to the first and the second secondary connections 33, 34. The output circuit 80 comprises an output capacitor 81. A first electrode of the output capacitor 81 is coupled to the second secondary connection 34. A second electrode of the output capacitor 81 is connected to the first secondary connection 33. The second electrode of the output capacitor 81 is connected to the reference potential connection 27. A first diode 82 couples the second secondary connection 34 to the first electrode of the output capacitor 81. A second diode 83 connects the second secondary connection 34 to the first secondary connection 33. A tap on the second secondary connection 34 is connected to a voltage input 84 of the control circuit 24', via a voltage measurement input 89 of the circuit arrangement 20. Thus, the output circuit 80 is coupled to the circuit arrangement 20.

The control unit 24 comprises a voltage comparator 85. A first input of the voltage comparator 85 is connected to the voltage input 84. In addition, the control unit 24' comprises a reference voltage source 86, which connects a second input of the voltage comparator 85 to the reference potential connection 27. Moreover, the control unit 24' comprises a digital circuit 87 and a control circuit 88. An output of the voltage comparator 85 is connected to a control input of the digital circuit 87. The control circuit 88 is connected at a first input to the current sensor 21. An output of the control circuit 88 is connected to an oscillator input 42 of the oscillator 25. The digital circuit 87 is connected at an output to another input of the oscillator 25. At another output, the digital circuit 87 is connected to another input of the control circuit 88.

The predetermined current value IS is supplied to the second input of the control circuit 88. The incoming current signal IM is supplied to the first input of the control circuit 88. The reference voltage source 86 makes available a predetermined voltage value VEOC. The predetermined voltage value VEOC is compared with a voltage made accessible in the output circuit 80, namely, of the secondary side voltage V0. If the voltage made accessible in the output circuit 80 is greater than the predetermined voltage value VEOC, then the voltage comparator 85 makes available a signal at its output that stops the oscillator 25 and thus the voltage transformation. If the voltage made accessible in the output circuit 80 is smaller than or equal to the predetermined voltage value VEOC, then the voltage comparator 85 makes available a signal at its output that activates the oscillator 25 and thus the voltage transformation. The voltage transformer 19 is used so as to charge the output capacitor 81. A starting signal STA can be supplied to the digital circuit 87. The starting signal STA triggers a beginning of a charging process of the output capacitor 81. The digital circuit 87 makes available a processing signal SDO at an output.

During the regulation, not only is the magnitude of the incoming current IE advantageously considered, but also the attained voltage in the output circuit 80.

In an alternative embodiment, the first input of the voltage comparator 85 is connected in accordance with the broken line to a tap in the output circuit 80, which is connected to the first electrode of the output capacitor 81. By means of the coupling of the output circuit 80 and the voltage comparator 85, the output voltage VOUT is detected and compared with the predetermined voltage value VEOC. The control unit 24' is in operation until the output voltage VOUT attains the predetermined voltage value VEOC.

Figure 6:
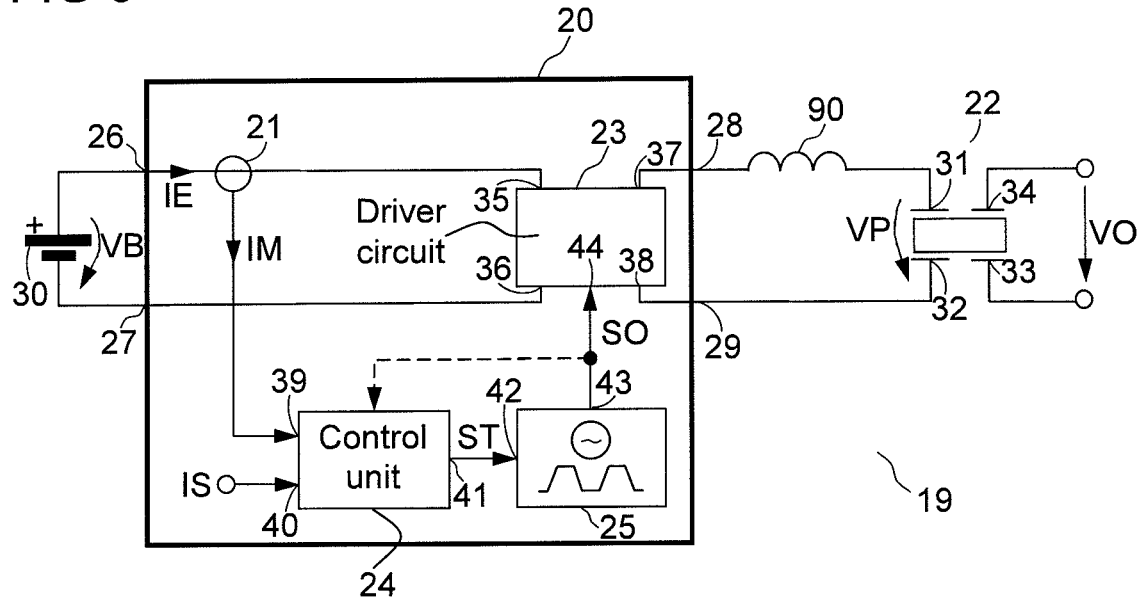

FIG. 6 shows a refinement of the voltage transformer in accordance with FIG. 1A, which is a further development of the voltage transformer depicted in the FIGS. 1-5. The voltage transformer 19 comprises a coil 90. The coil 90 connects the circuit arrangement 20 to the piezo transformer 22. The coil 90 is located between the first output 28 of the circuit arrangement 20 and the first primary connection 31. The coil 90 and the primary side of the piezo transformer 22 form a resonant circuit. The resonant circuit is implemented as a series resonant circuit. A piezo transformer 22 can have a high input capacity. Therefore, it can be advantageous to charge and discharge the input capacity of the piezo transformer 22 with the coil 90. Thus, a high energy efficiency is attained.

In an alternative embodiment, the oscillator output 43 is connected to another control input of the control unit 24.

Figure 7:
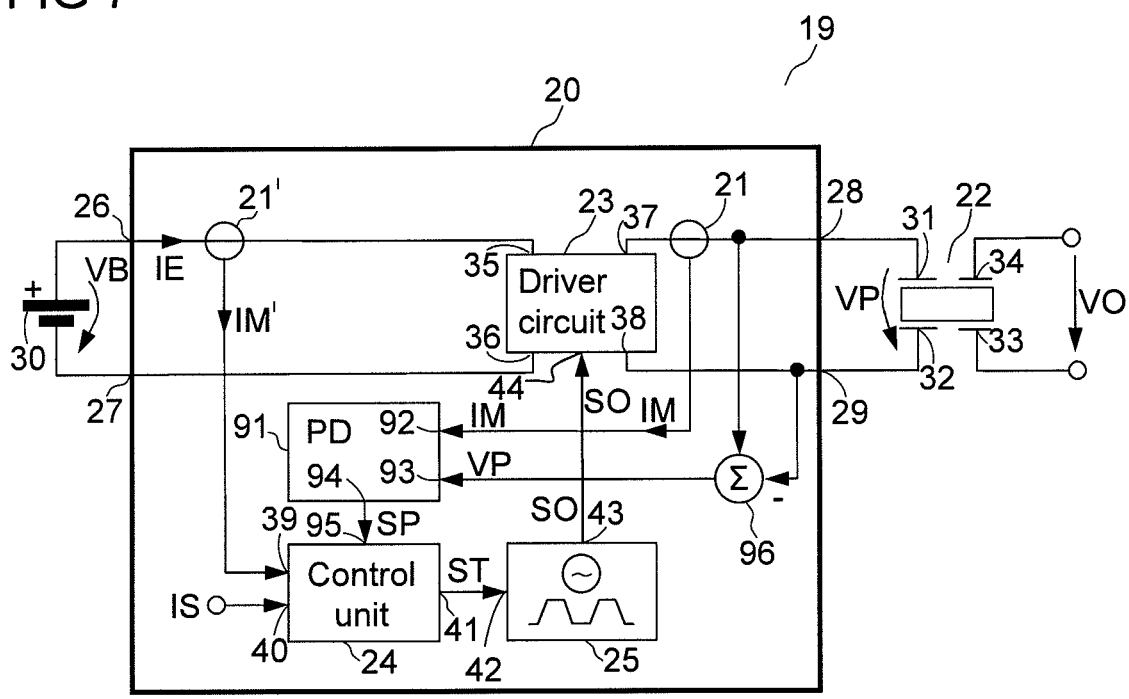

FIG. 7 shows another exemplified embodiment of a voltage transformer according to the invention, which is a further development of the voltage transformer depicted in the FIGS. 1-6. The circuit arrangement 20 comprises the driver circuit 23, the control unit 24, and the oscillator 25. Moreover, the circuit arrangement 20 comprises a phase detector 91. The phase detector 91 has a current signal input 92, an additional signal input 93, and a phase signal output 94. The current signal input 92 is connected to the output of the current sensor 21. The current sensor 21 is located between the driver circuit 23 and the piezo transformer 22. The additional signal input 93 is connected to the first driver output 37 of the driver circuit 23 and thus to the first output 28 of the circuit arrangement 20. Furthermore, the circuit arrangement 20 comprises an adder 96. A first input of the adder 96 is connected to the first driver output 37 and thus is connected to the first output 28 of the circuit arrangement 20. A second input of the adder 96 is connected to the second driver output 38 and thus is connected to the second output 29 of the circuit arrangement 20. The first input of the adder 96 is implemented as a noninverting input and the second input of the adder 96 is implemented as an inverting input. The adder 96 is thus used for subtraction. An output of the adder 96 is connected to the other signal input 93 of the phase detector 91. The phase signal output 94 is connected to a phase signal input 95 of the control unit 24. Another current sensor 21' is located between the supply voltage connection 26 and the first driver input 35 and is connected to the first control input 39.

The incoming current signal IM is thus supplied to the current signal input 92. On the other hand, a primary side voltage VP is supplied to the other signal input 93 of the phase detector 91. The primary side voltage VP drops between the first and the second driver output 37, 38 and thus between the first and the second primary connection 31, 32. The phase detector 91 can determine a phase difference between the incoming current signal IM and the primary side voltage VP. If the incoming current signal IM and the primary side voltage VP are in phase, then the oscillator 25 holds in readiness an outgoing signal SO with an oscillator frequency fO, which is the resonance frequency fr of the piezo transformer 22. The other current sensor 21' emits the other incoming current signal IM'. In addition, the other incoming current signal IM' is supplied via the first control input 39 and the predetermined current value IS of the control unit 24 via the second control input 40.

If only a small incoming current IE can be made available to the circuit arrangement 20, then the circuit arrangement 20 in accordance with FIG. 7 operates the piezo transformer 22 in the resonance frequency fr and thus uses the maximum possible amount of the incoming current IE. In this case, the incoming current signal IM' is smaller than the predetermined current value IS. After being turned on, the control unit 24 adjusts the oscillator 25 to the starting frequency f1, as shown in FIG. 2B. The control unit 24 is designed in such a way that it reduces the oscillator frequency fO until the resonance frequency fr is attained. The resonance frequency fr can be detected in that the phasing of the signal at the current signal input 92 and of the signal at the other signal input 93 of the phase detector 91 are the same. The control unit 24 is designed in such a way that it does not "skip" the impedance minimum. During the operation of the piezo transformer 22 at the resonance frequency fr, the energy utilization is advantageously increased.

In a not shown, alternative embodiment, the other current sensor 21' is omitted. The first control input 39 of the control unit 24 is thereby connected to the output of the current sensor 21. The incoming current signal IM is thus supplied both to the phase detector 91 and the control unit 24 also.

Figure 8:
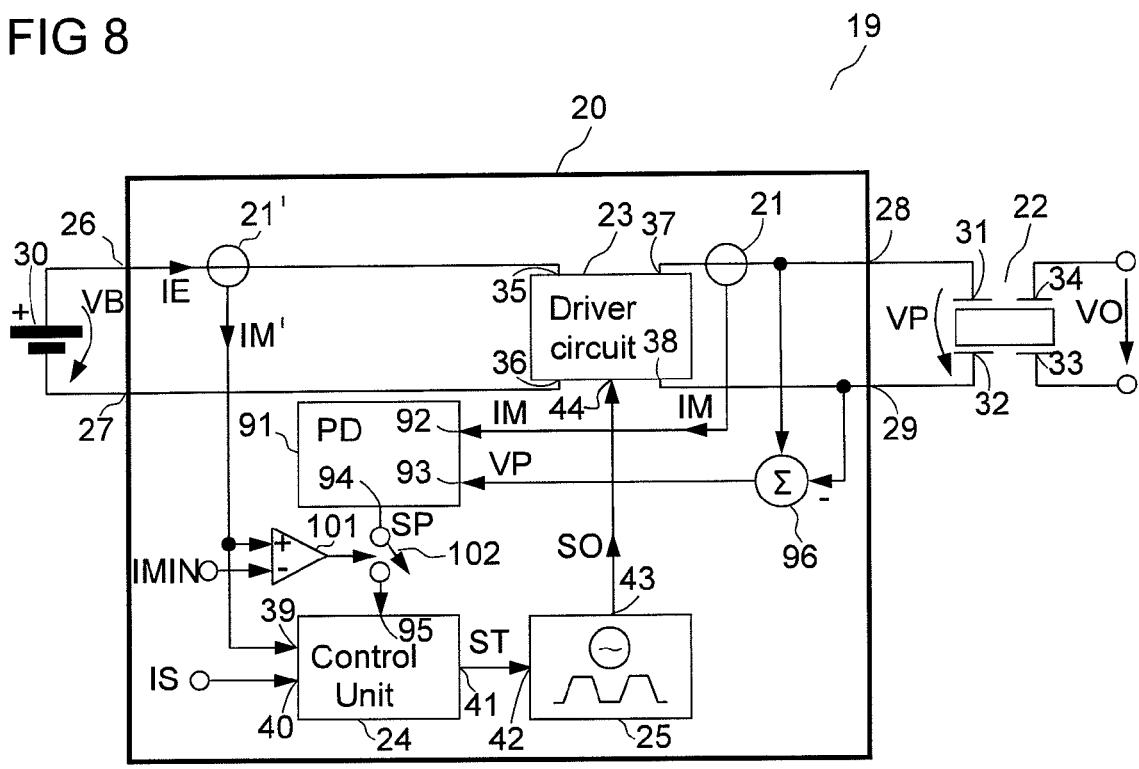

FIG. 8 shows another exemplified embodiment of a voltage transformer according to the proposed principle. FIG. 8 depicts a refinement of the voltage transformer depicted in FIG. 7. The circuit arrangement 20 has an additional comparator 101 and an additional switch 102. An input of the additional comparator 101 is connected to the other current sensor 21'. The additional switch 102 couples the phase signal output 94 to the phase signal input 95. An output of the additional comparator 101 is connected to a control connection of the additional switch 102.

The additional current sensor 21' produces another incoming current signal IM'. A minimum current value IMIN is supplied to the second input of the additional comparator 101. The additional comparator 101 thus compares the other incoming current signal IM' with the minimum current value IMIN. If the other incoming current signal IM' is smaller than the minimum current value IMIN, then the additional switch 102 is opened. Thus, a signal from the phase detector 91 is not supplied to the phase signal input 95 of the control unit 24. Since with small incoming currents, the phases of the other current signal IM' can fluctuate, then by means of the additional comparator 101 and the additional switch 102, it is possible for the control to take place without taking into consideration the phasing with such small current values. By comparing the other incoming current signal IM' with the minimum current value IMIN, the result is that the phase detection has no influence on the control unit 24 if the incoming current IE has a very small value. If, on the other hand, the other incoming current signal IM' is greater than the minimum current value IMIN, then the additional switch 102 is closed. The regulation thus takes place as a function of the phasing between the incoming current signal IM and the primary side voltage VP also. With greater incoming currents, interfering frequencies or interfering resonance frequencies, spurious frequencies in English, have no influence on the phase detection and thus on the regulation. Such an interference of the resonance frequency is exhibited at 650 KHz in FIG. 2B.

In an alternative, not shown embodiment, the phase detector 91 compares the phase difference between the primary side voltage VP and the incoming current signal IM with a predetermined phase value. If the phase difference is greater than the predetermined phase value, then the control unit 24 changes the oscillator frequency fO.

Figure 9A:
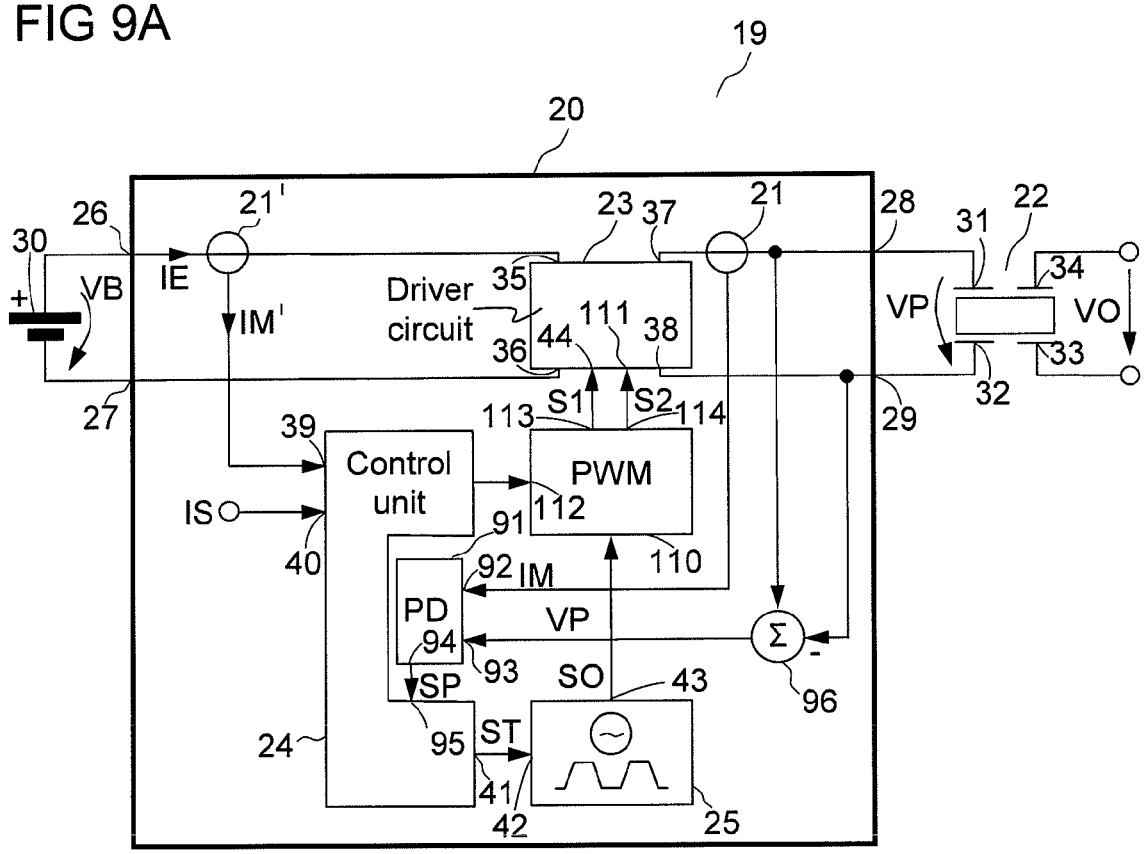
FIGS. 9A and 9B, an alternative embodiment of a voltage transformer according to the invention, and outgoing signals of a pulse width modulator.

FIG. 9A shows another exemplified embodiment of a voltage transformer according to the invention. FIG. 9A depicts a further development of the embodiments shown in FIGS. 7 and 8. The circuit arrangement 20 in accordance with FIG. 9A comprises, just as the circuit arrangements in the FIGS. 7 and 8, the driver circuit 23, the current sensor 21, the control unit 24, and the oscillator 25. Furthermore, the circuit arrangement 20 comprises a pulse width modulator 110. The pulse width modulator 110 is connected between the oscillator 25 and the driver circuit 23. The oscillator output 43 is connected to an input of the pulse width modulator 110. A modulator output 113 of the pulse width modulator 110 is connected to the driver signal input 44. Another modulator output 114 of the pulse width modulator 110 is connected to another driver signal input 111 of the driver circuit 23. An output of the control unit 24 is connected to a modulator control input 112 of the pulse width modulator 110. The mode of functioning is explained in more detail with the aid of FIG. 9B.

Figure 9B:
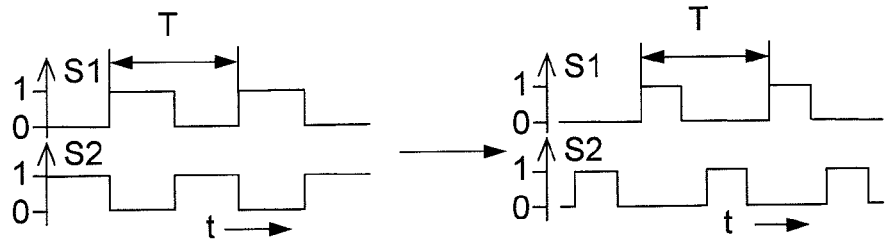

FIG. 9B shows by way of example signals at the output of the pulse width modulator 110 shown in FIG. 9A. The pulse width modulator 110 emits a modulator signal S1 at the pulse modulator output 113. Furthermore, the pulse width modulator 110 emits another modulator signal S2 at the other pulse modulator output 114. FIG. 9B, on the left side, shows the modulator signal S1 and the other modulator signal S2 with the maximum pulse duty factor. The pulse duty factor is 1/2 since the two signals have the value 1 during half of one cycle duration T. If the incoming pulse signal IM is greater than the predetermined current value IS, then the pulse duty factor is reduced. Modulator signals S1, S2 with a reduced pulse duty factor are shown on the right side of FIG. 9B. The length of time for which the modulator signal S1 takes the value 1 is smaller than half of the cycle duration T. The duty cycle is thus smaller than 1/2. As a result of the reduced pulse duty factor, less energy is supplied to the primary side of the piezo transformer 22. The incoming current signal IM is reduced until the incoming current signal IM corresponds approximately to the predetermined current value IS. The control unit 24 carries out a frequency search similar to FIG. 2B, but stops only if the oscillator frequency fO is the resonance frequency fr. If the incoming current IE is too high, the incoming current IE is reduced by a reduction of the time in which the piezo transformer 22 is connected to the supply source 30. To this end, a third operating state and a pulse width modulation are used.

The oscillator 25 is advantageously adjusted to the resonance frequency fr of the piezo transformer 22 by the control unit 24. Since the primary side of the piezo transformer 22 fluctuates at or close to the resonance frequency fr, a very high energy efficiency is attained. In order to limit the incoming current IE, the pulse duty factor is reduced by means of the pulse width modulator 110. A tap on the primary side of the piezo transformer 22 is advantageously sufficient for the phase detector 91.

Figure 10:
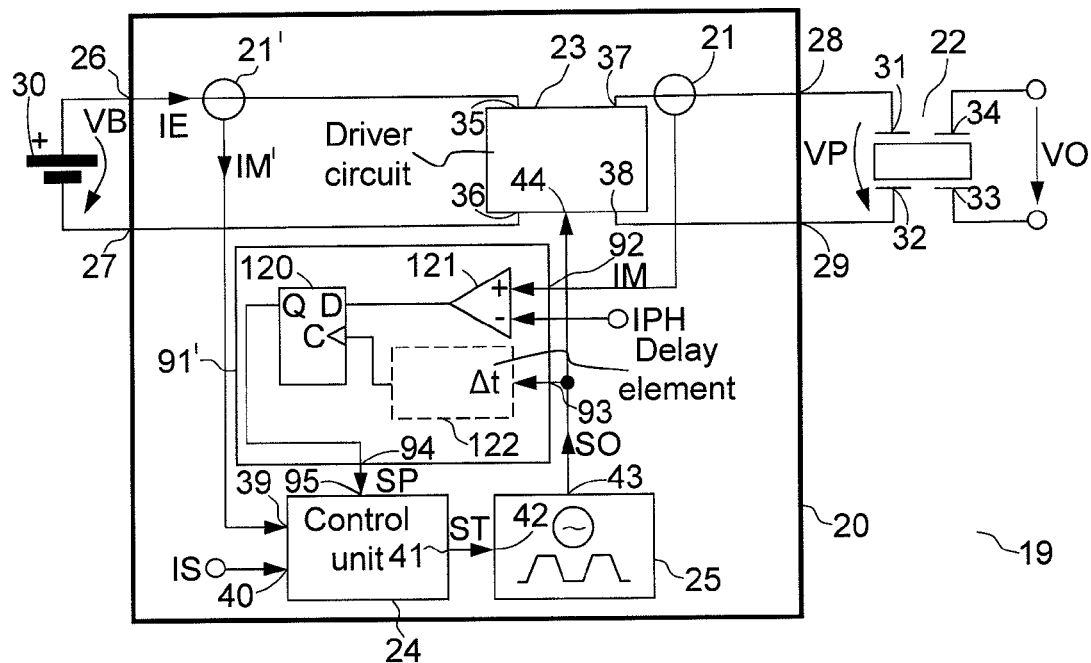
FIGS. 10, 11, 12A, and 12B, other examples of embodiments of a voltage transformer, according to the invention.

FIG. 10 shows another exemplified embodiment of a voltage transformer according to the invention. FIG. 10 represents a further development of the circuit arrangement 20 depicted in the FIGS. 7, 8, and 9. The phase detector 91' has the current signal input 92 and the other signal input 93. The oscillator 25 is coupled to the other signal input 93. In addition, the other signal input 93 is connected to the oscillator output 43. The phase detector 91' comprises a flip-flop 120. A cycle input of the flip-flop 120 is connected to the other signal input 93. A data input D of the flip-flop 120 is coupled to the current signal input 92. A data output Q of the flip-flop 120 is connected to the phase signal output 94. The phase detector 91' comprises a phase detector comparator 121. The phase detector comparator 121 is connected to the current signal input 92 at a first input. Furthermore, the phase detector comparator 121 is connected at an output to the data input D of the flip-flop 120.

A predetermined current reference value IPH is supplied to another input of the phase detector comparator 121. The flip-flop 120 is formed as a cycle state-controlled flip-flop. A signal applied on the data signal input D of the flip-flop 120 is switched further to the data output Q of the flip-flop 120, if the logical value 1 is applied on the cycle input C of the flip-flop 120. If the logical value 0 is applied on the cycle input C, then the signal applied on the data signal input D is not switched to the data output Q. Therefore, if the oscillator signal SO has the logical value 1, then the phase signal is set on the logical value 1 or on the logical value 0 as a function of the incoming current signal IM. If the incoming current signal IM is greater than the predetermined current reference value IPH, then the signal applied on the data input D has the logical value 1. If the incoming current signal IM is smaller than the predetermined current reference value IPH, then the signal on the data input D has the logical value 0. With a logical value 1 of the oscillator signal SO, the signal applied on the data input D is switched to the data output Q of the flip-flop 120 and thus to the phase signal output 94. A signal at the output of the phase detector comparator 121 can be stored digitally in the transition of the oscillator signal SO from 0-1. Therefore, the phase detection takes place slightly earlier, before the transistors in the driver circuit 23 are switched.

The oscillator signal SO advantageously has approximately the same phasing as the primary voltage VP. Instead of the primary side voltage VP as in the FIGS. 7, 8, and 9A, the oscillator signal SO can be used for the phase detection. Thus, the expenditure for the implementation of the circuit arrangement 20 is reduced. The phase detector 91 has only a few components and therefore can be implemented with a low expenditure. A phase regulation can be advantageously dependent on the type of the piezo transformer 22 and the magnitude of the incoming current IE.

In an alternative embodiment, a delay element 122 can be placed between the other signal input 93 of the phase detector 91' and the cycle input C of the flip-flop 120. With the delay element 122, it is possible to balance the time with which the oscillator signal SO hurries ahead of the primary side voltage VP. The delay element 122 can produce a slight time shift of the detection timepoint. Thus, the accuracy of the phase detection is increased.

In an alternative, not shown embodiment, the other current sensor 21' can be omitted in the FIGS. 7-10. The current sensor 21 then makes available the incoming current signal IM for the control unit 24 and the phase detector 91.

Figure 11:
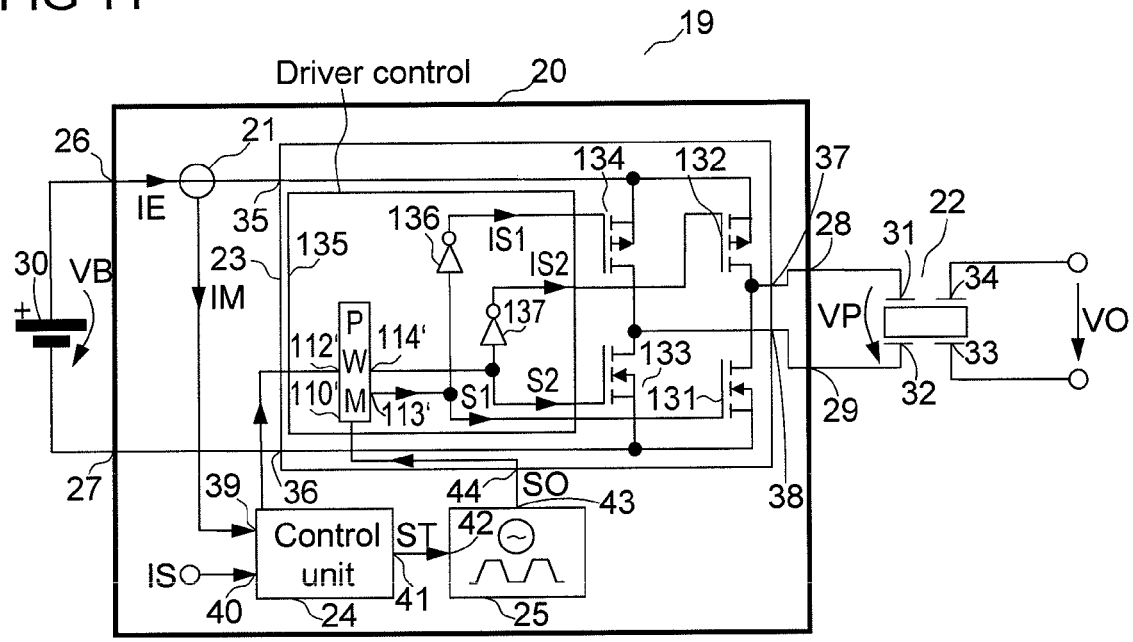

FIG. 11 shows another exemplified embodiment of a voltage transformer according to the invention. FIG. 11 represents a refinement of the voltage transformer depicted in the FIGS. 1-10. The driver circuit 23 comprises a first transistor 131, which connects the first primary connection 31 to the reference potential connection 27. A second transistor 132 of the driver circuit 23 connects the supply voltage connection 26 to the first primary connection 31. Moreover, a third transistor 133 of the driver circuit 23 connects a second primary connection 32 to the reference potential connection 27. Furthermore, a fourth transistor 134 of the driver circuit 23 connects the supply voltage connection 26 to the second primary connection 32. Moreover, the driver circuit 23 comprises a driver control 135. The driver control 135 is connected on the input side to the driver signal input 44. The driver control 135 is connected on the output side to the control connections of the first, the second, the third, and the fourth transistor 131-134.

The oscillator signal SO is supplied to the driver control 135. As a function of the oscillator signal SO, the driver control 135 controls the control connections of the four transistors 131-134. The first and the fourth transistors 131, 134 are conductively connected in a first half of the cycle duration T. The second and the third transistors 132, 133 are blocked in the first half of the cycle duration T. On the other hand, in the second half of the cycle duration T, the first and the fourth transistors 131, 134 are blocked. Furthermore, the second and the third transistors 132, 133 are conductively connected in the second half of the cycle duration T. The four transistors 131-134 are implemented as metal oxide semiconductor field effect transistors, abbreviated as MOSFETs. The first and the third transistors 131, 133 are of the same conductivity type. Likewise, the second and the fourth transistors 132, 134 are of the same conductivity type. The first and the third transistors 131, 133 are of the opposite conductivity type, compared with the second and the fourth transistors 132, 134. The second and the fourth transistors 132, 134 are implemented as a p-channel MOSFET. On the other hand, the first and the third transistors 131, 133 are implemented as an n-channel MOSFET. The driver circuit 23 is also designated as an H-bridge driver circuit. The driver control 135 is designed in such a way that the first and the second transistors 131, 132 do not simultaneously conduct. Likewise, the driver control 135 is implemented so that the third and the fourth transistor 133, 134 do not simultaneously conduct. Thus, a short circuit between the supply voltage connection 26 and the reference potential connection 27 is avoided.

The driver control 135 comprises a pulse width modulator 110' that operates similarly to the pulse width modulator 110 shown in FIGS. 9A and 9B. A modulator output 113' of the pulse width modulator 110' is coupled to the control connections of the first and the fourth transistor 131, 134. An additional modulator output 114' of the pulse width modulator 110 is coupled to the control connections of the second and the third transistor 132, 133. The driver control 135 comprises an inverter 136 which couples the modulator output 113' to the control connection of the fourth transistor 134. The driver control 135 comprises an additional inverter 137 which couples the additional modulator output 114' to the control connection of the second transistor 132. The modulator signal S1 that is provided at the modulator output 113' is applied to the control connection of the first transistor 131. The inverter 136 generates an inverted modulator signal IS1 that is the inverted signal to the modulator signal S1. The inverted modulator signal IS1 is applied to the control connection of the fourth transistor 134. Correspondingly, the other modulator signal S2 is provided at the additional modulator output 114' and is applied to the control connection of the third transistor 133. The additional inverter 137 generates another inverted modulator signal IS2 that is the inverted signal to the other modulator signal S2. The other inverted modulator signal IS2 is applied to the control connection of the second transistor 132. Examples for the modulator signal S1 and the other modulator signal S2 are shown in FIG. 9B. In case the modulator signal S1 has a logical value 1, a positive voltage is applied to the control connection of the first transistor 131 and a negative or zero voltage is applied to the control connection of the fourth transistor 134 leading to the effect that the first and the fourth transistor 131, 134 are conducting. In case the modulator signal S1 has a logical value 0, the first and the fourth transistor 131, 134 are blocking. In case the other modulator signal S2 has a logical value 1, a positive voltage is applied to the control connection of the third transistor 133 and a negative or zero voltage is applied to the control connection of the second transistor 132 leading to the effect that the second and the third transistor 132, 133 are conducting. In case the other modulator signal S2 has a logical value 0, the second and the third transistor 132, 133 are blocking. As shown in FIGS. 9A and 9B, the driver control 135 can also control four transistors 131-134 during one cycle so that the four transistors 131-134 are simultaneously blocked. The driver control 135 can be designed in such a way that with the four transistors 131-134, the switching on or switching off takes place in ramp form. A control of the switching on or switching off process takes place, slew-rate control in English. In this way the electromagnetic compatibility of the circuit arrangement 20 can be advantageously increased.

In an alternative, not shown embodiment, the third and the fourth transistors 133, 134 are omitted. The control of the piezo transformer 22 thus takes place with half a bridge. The driver circuit 23 thereby comprises the first and the second transistors 131, 132 and the driver control 135. The second primary connection 32 is hereby connected with the reference potential connection 27.

Figure 12:
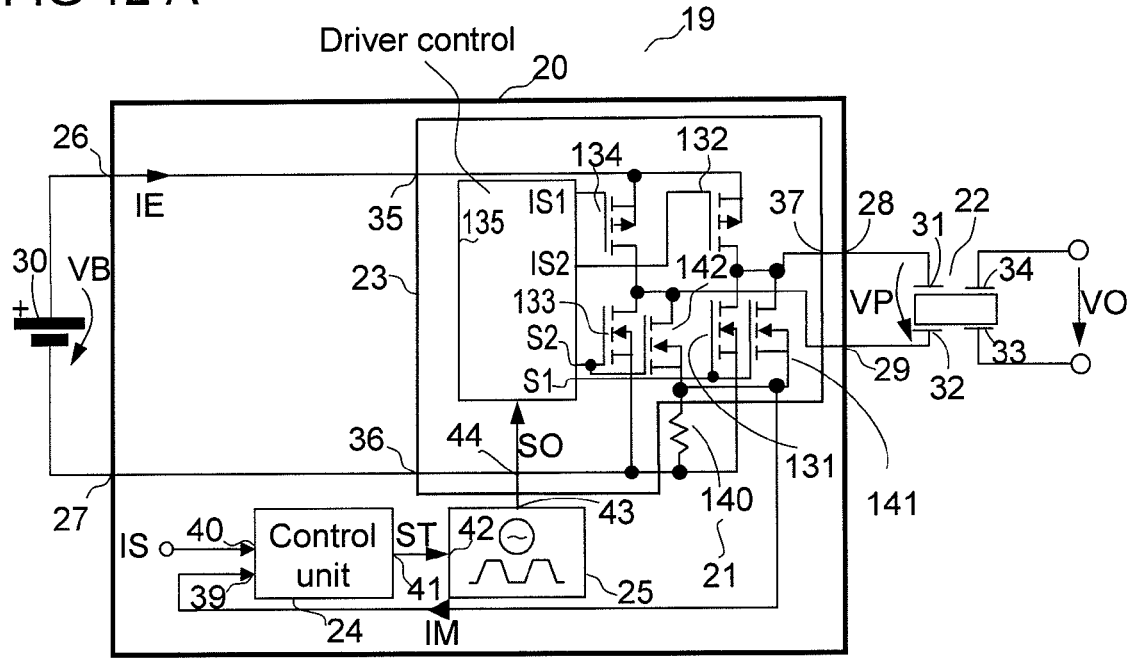
Figure 12:
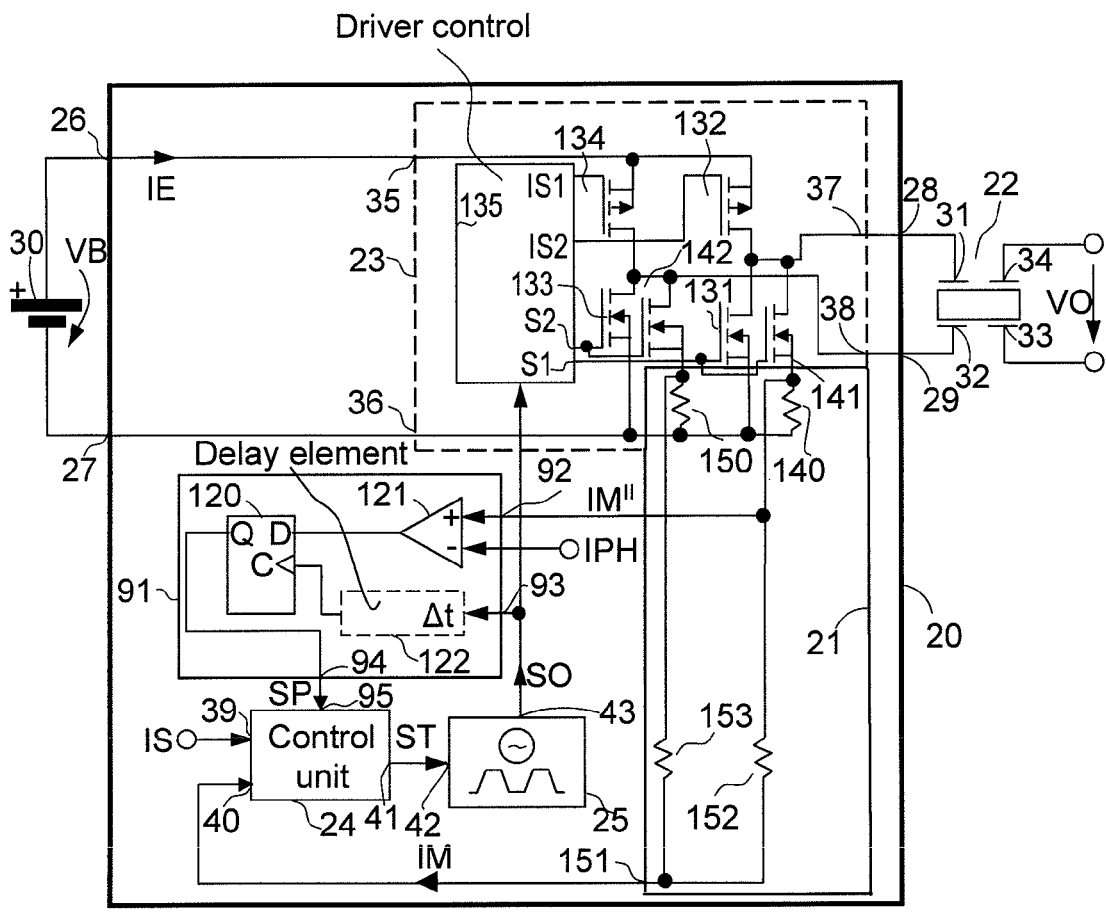

FIG. 12A shows another exemplified embodiment of a voltage transformer, which is a refinement of the embodiment shown in FIG. 11. In accordance with FIG. 12A, the current sensor 21 comprises a measurement resistor 140. Furthermore, the driver control 23 comprises a first measurement transistor 141. A series circuit consisting of the first measurement transistor 141 and the measurement resistor 140 is located between the first primary connection 31 and the reference potential connection 27. A node between the measurement resistor 140 and the first measurement transistor 141 is connected to the input 39 of the control input 24. Furthermore, the driver circuit 23 comprises a second measurement transistor 142, which is located between the second primary connection 32 and the node between the first measurement transistor 141 and the measurement resistor 140. The first transistor 131 has an n-fold current carrying capacity, compared with the first measurement transistor 141. A width-to-length ratio of the first transistor 131 is greater by the factor n than a width-to-length ratio of the first measurement transistor 141. Likewise, the third transistor 133 has an n-fold current carrying capacity or an n-fold width-to-length ratio compared with the second measurement transistor 142. A control connection of the first measurement transistor 141 is connected to the control connection of the first transistor 131. Correspondingly, a control connection of the second measurement transistor 142 is connected to the control connection of the third transistor 133.

The first transistor 131 and the first measurement transistor 141 conduct simultaneously. However, the n-fold of the current, which flows through the first measurement transistor 141, flows through the first transistor 131. The input current signal IM is the voltage that drops at the measurement resistor 140. The incoming current signal IM is thus a measure for the current that flows through the first measurement transistor 141 and thus also, a measure for the current flowing through the first transistor 131. The incoming current signal IM is thus proportional to the magnitude of the incoming current IE. Since during the second half of the cycle duration T, the first transistor 131 blocks and the third transistor 133 conducts, the incoming current IE flows in this time through the third transistor 133 or through the second measurement transistor 142. During the second half of the cycle duration T, the incoming current signal IM is also proportional to the incoming current IM.

The main part of the incoming current IE advantageously flows almost without ohmic losses. Only a small fraction of the incoming current IE flows through the measurement resistor 140. Thus, the incoming current signal IM can be made available with high effectiveness. The output path of the driver circuit 23 advantageously is free of ohmic resistors.

FIG. 12B shows another exemplified embodiment of a voltage transformer. The driver circuit 23 in accordance with FIG. 12B represents a refinement of the driver circuit from FIGS. 11 and 12A. The current sensor 21 comprises the measurement resistor 140 and another measurement resistor 150. The driver circuit 23 comprises the first and the second measurement transistor 141, 142. A series circuit, comprising the other measurement resistor 150 and the second measurement transistor 142, is switched between the second primary connection 32 and the reference potential connection 27. The node between the first measurement transistor 141 and the measurement resistor 140 is connected to an output 151 of the current sensor 21 via a first adder resistor 152. Correspondingly, a node between the second measurement transistor 142 and the other measurement resistor 150 is connected to the output 151 of the current sensor 21 via a second adder resistance 153. The phase detector 91 is implemented as shown in FIG. 10. The current signal input 92 of the phase detector 91 is connected to the node between the first measurement transistor 141 and the measurement resistor 140. The incoming current signal IM is made accessible on the output 151 of the current sensor 21. The incoming current signal IM is formed as current. Thus, the incoming current signal IM is formed in the first half of the cycle duration by a current through the first adder resistor 152 and during the second half of the cycle duration T by a current through the second adder resistor 153. An additional incoming current signal IM″ is made available to the current signal input 92 of the phase detector 91', which is proportional to the incoming current IE during the first half of the cycle duration. Thus, the signal changes exclusively once from 0 to 1 at the data input of the flip-flop 120 during one cycle.

Figure 13:
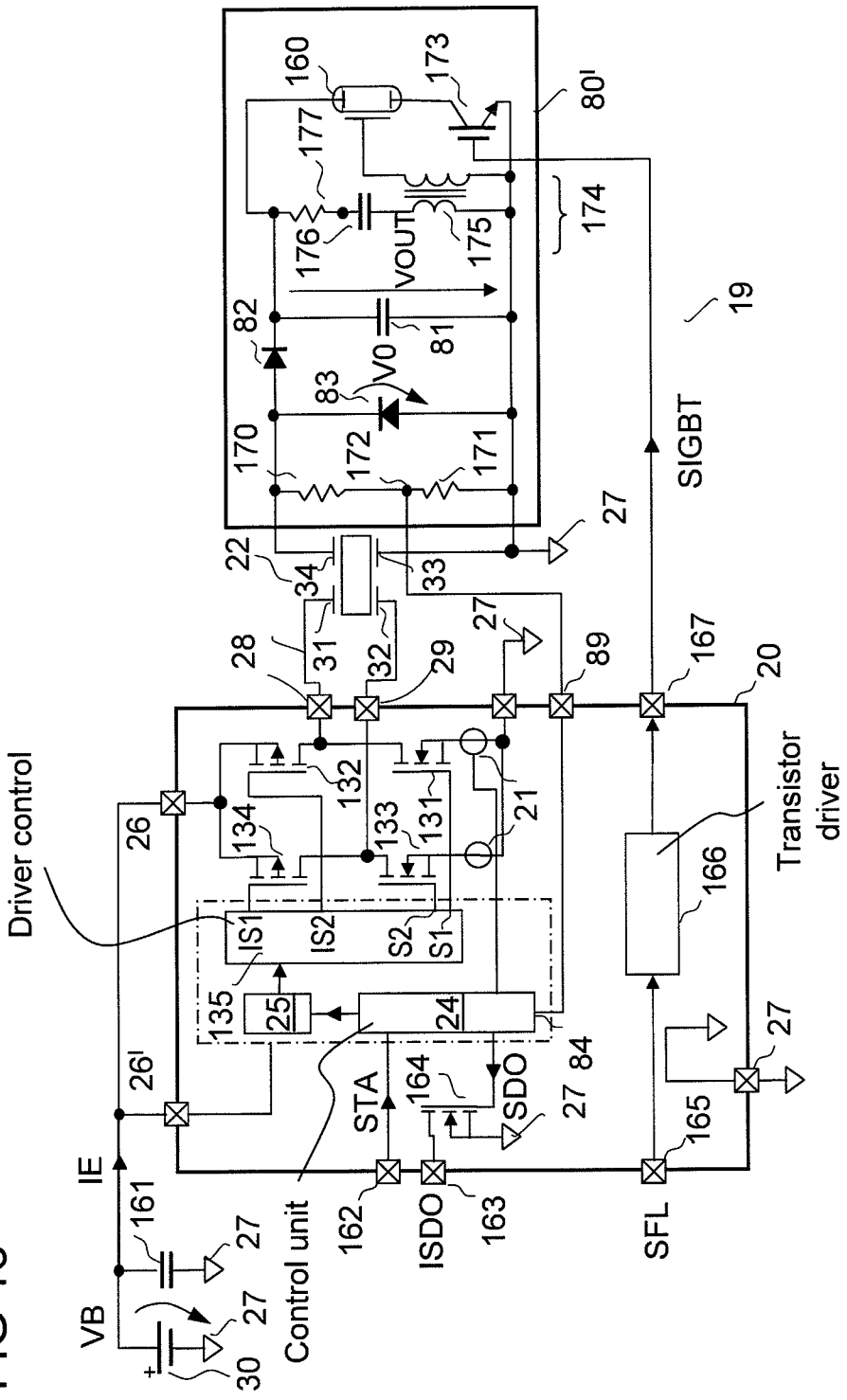
FIG. 13, an example of an embodiment of a lighting arrangement comprising a voltage transformer according to the invention.

FIG. 13 shows an exemplified embodiment of a lighting device according to the invention. The lighting arrangement comprises the voltage transformer 19 and a light source 160. The light source 160 is implemented as a xenon lamp. The light source 160 is designed to emit flashes. The voltage transformer 19 has the supply source 30. The supply source 30 is implemented as a battery. A smoothing capacitor 161 is connected between the supply voltage connection 26 and the reference potential connection 27. The circuit arrangement 20 of the voltage transformer 19 can be implemented in accordance with an embodiment shown in the FIGS. 1-12B. For example, the circuit arrangement can be implemented in accordance with the design in FIG. 12B. The circuit arrangement 20 can have a starting signal input 162, which is connected to an input of the control unit 24. The circuit arrangement 20 has a processing connection 163, which is connected to the control unit 24. The circuit arrangement 20 comprises a signal transistor 164, which connects the processing connection 163 to the reference potential connection 27. A control connection of the signal transistor 164 is connected to an output of the control unit 24. The circuit arrangement 20 has moreover a flash release input 165, a transistor driver 166, and a flash release output 167. The transistor driver 166 couples the flash release input 165 to the flash release output 167.

In addition to the elements of the output circuit 80 shown in FIG. 5, the output circuit 80' comprises in accordance with FIG. 13 a voltage divider, which connects the first secondary connection 33 to the second secondary connection 34. The voltage divider has a first voltage divider resistor 170 and a second voltage divider resistor 171. A node 172 between the first and the second voltage divider resistor 170, 171 is connected to the voltage measurement input 89 of the circuit arrangement 20. The voltage measurement input 89 is connected to the voltage input 84 of the control unit 24 as shown in FIG. 5. The light source 160 is connected between the first and the second electrodes of the output capacitor 81.

The output circuit 80' comprises a flash release transistor 173, which is connected in series to the light source 160. The series circuit comprising the light source 160 and the flash release transistor 173 connects the first electrode of the output capacitor 81 to the second electrode of the output capacitor 81. The light source 160 is connected to the first electrode of the output capacitor 81. On the other hand, the flash release transistor 173 is connected to the second electrode of the output capacitor 81. The second electrode of the output capacitor 81 is connected to the reference potential connection 27. A capacity value of the output capacitor 81 can be, for example, 22 μF. The flash release output 167 is connected to a control connection of the flash release transistor 173. The flash release transistor 173 is implemented as a bipolar transistor with an insulated gate, insulated gate bipolar transistor in English, abbreviated as IGBT.

Furthermore, the output circuit 80' comprises a trigger circuit 174. The trigger circuit 174 comprises a trigger transformer 175, a trigger capacitor 176, and a trigger resistor 177. A series circuit comprising the trigger resistor 177, the trigger capacitor 176, and a primary side of the trigger transformer 175 is connected between the first electrode and the second electrode of the output capacitor 81. The trigger resistor 177 is thereby connected to the first electrode of the output capacitor 81, and the primary side of the trigger transformer 175, to the second electrode of the output capacitor 81. The trigger capacitor 176 is placed between the trigger resistor 177 and the primary side of the trigger transformer 175. A node between the trigger resistor 177 and the trigger capacitor 176 is connected to a node between the light source 160 and the flash trigger transistor 173. A secondary side of the trigger transformer 175 connects the second electrode of the output capacitor 81 to a control connection of the light source 160.

A starting signal STA on the starting input 162 triggers the beginning of the operation of the piezo transformer 122, so that a voltage is generated on the output of the piezo transformer 122. An inverted processing signal ISDO is made available at the processing connection 163. As shown, for example, in FIG. 5, the control unit 24 makes available a processing signal SDO, which is supplied to the control connection of the processing transistor 164. By means of the processing transistor 164, the inverted processing signal ISDO is generated. A flash release signal SFL is supplied to the flash release input 165. A flash release signal SIGBT can be made accessible to the flash release output 167; it is supplied to the control input of the flash release transistor 173. The output voltage VOUT, dropping across the output capacitor 81, can, for example, be a value of 330 V.

Compared with a measurement on the secondary side of the piezo transformer 22, on which a high output voltage VOUT can be present, the measurement on the primary side of the piezo transformer 22 is advantageously possible at a low cost. The circuit arrangement 20 can be used so as to charge an output capacitor 81, in particular if a high output voltage VOUT is required. In particular, the circuit arrangement 20 can be employed for a use in lighting. It makes possible a charging of the output capacitor 81, for example for the creation of a flash by means of xenon light source 160. Advantageously, it is possible to make available a high output voltage VOUT by means of the piezo transformer 122. The regulation on the basis of an accurate determination of the incoming current IE makes possible a simple integration of the circuit arrangement 20 and the output circuit 80 into a portable system, in particular, into a mobile radio communication device. The incoming current IE is advantageously regulated at the value of the predetermined current value IS. In battery-operated systems, such as a mobile radio communication device, the battery can only make available a current up to a certain value. An uncontrolled current consumption is advantageously avoided by the current limitation with the circuit arrangement 20. In this way, it is possible to avoid an unwanted switching off of the device of the mobile radio communication if, for example, a high frequency current amplifier is simultaneously operated with the circuit arrangement 20.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

We claim:

1. A circuit arrangement for a piezo transformer, comprising:
    a driver circuit adapted to be coupled to the piezo transformer, the driver circuit comprising:
        a first transistor for the coupling of a reference potential connection to a first primary connection of the piezo transformer,
        a second transistor for the coupling of a supply voltage connection to the first primary connection of the piezo transformer, and
        a driver control, which is coupled on the input side to the driver signal input and on the output side to control connections of the first and the second transistors;
    a current sensor that is configured to generate an incoming current signal as a function of an incoming current flowing through the piezo transformer;
    a control unit configured to generate a control signal in such a way that the incoming current signal is smaller than or equal to a predetermined current value; and
    an oscillator with an oscillator output to emit an oscillator signal at a driver signal input of the driver circuit as a function of the control signal,
    wherein the current sensor comprises a measurement resistor, wherein the driver circuit comprises a first measurement transistor, wherein the driver control of the driver circuit, on the output side, is further coupled to a control connection of the first measurement transistor, wherein the driver circuit comprises a series circuit including the measurement resistor and the first measurement transistor, wherein the series circuit is arranged between the first primary connection and the reference potential connection, and wherein the incoming current signal can be tapped at a node between the measurement resistor and the first measurement transistor.

2. The circuit arrangement according to claim 1, wherein the control unit comprises a comparator, comprising:
    a first comparator input, to which the incoming current signal can be supplied;
    a second comparator input adapted to receive a predetermined current value; and
    a comparator output, which is coupled to a first control output of the control unit.

3. The circuit arrangement according to claim 2, wherein the oscillator comprises:
    a frequency generator; and
    a phase-locked loop, which is coupled at a cycle input of the phase-locked loop to an output of the frequency generator and at an output of the phase-locked loop to the oscillator output, and
    wherein the control unit comprises:
    a counter with an input, which is coupled to the comparator output;
    a cycle input, which is coupled to the output of the frequency generator; and
    an output, which is coupled to a control input of the phase-locked loop.

4. The circuit arrangement according to claim 1, wherein the oscillator is a voltage-controlled oscillator and the control signal is a voltage signal.

5. The circuit arrangement according to claim 4, wherein the control unit comprises:
    a control capacitor, at which the control signal can be tapped;
    a starting voltage source, which is coupled to a first electrode of the control capacitor and at which a starting value of the control signal can be tapped; and
    a first current source, which is coupled to the first electrode of the control capacitor and from which a current can be generated as a function of a comparison of the incoming current signal with a predetermined current value.

6. The circuit arrangement according to claim 1, comprising a phase detector, comprising:
a current signal input;
another signal input, which is coupled on the input side to a first and/or a second driver output of the driver circuit or, alternatively, is coupled to the oscillator output; and
a phase signal output, which is coupled to a phase signal input of the control unit and on which a phase signal can be tapped, which is generated as a function of the signals on the current signal input and on the other signal input.

7. The circuit arrangement according to claim 1, comprising a pulse width modulator, which is arranged between the oscillator output and the driver signal input and is coupled at a modulator control input to an output of the control unit.

8. A voltage transformer, comprising a circuit arrangement according to claim 1, and the piezo transformer.

9. The voltage transformer according to claim 8, wherein the control unit comprises a voltage input, which is coupled to a first and/or second secondary connection of the piezo transformer, and the control unit is designed to generate the control signal as a function of a comparison of a signal at the voltage input and a predetermined voltage value.

10. A lighting arrangement, comprising a voltage transformer according to claim 8, and a light source, which is coupled to a first and a second secondary connection of the piezo transformer.

11. A method to control a piezo transformer, comprising:
generating an incoming current for the piezo transformer;
generating an incoming current signal as a function of the incoming current;
generating a control signal in such a way that the incoming current signal is equal to a predetermined current value;
emitting an oscillator signal as a function of the control signal; and
controlling the piezo transformer as a function of the oscillator signal,
wherein the control signal influences a frequency of the oscillator signal, and wherein the emitting the oscillator signal as a function of the control signal comprises emitting the oscillating signal with an operating point frequency at which the incoming current signal is equal to the predetermined current value.

12. A circuit arrangement for a piezo transformer, comprising:
a driver circuit adapted to be coupled to the piezo transformer;
a current sensor that is configured to generate an incoming current signal as a function of an incoming current flowing through the piezo transformer;
a control unit configured to generate a control signal in such a way that the incoming current signal is smaller than or equal to a predetermined current value, the control unit comprising:
a control capacitor, at which the control signal can be tapped;
a starting voltage source, which is coupled to a first electrode of the control capacitor and at which a starting value of the control signal can be tapped; and
a first current source, which is coupled to the first electrode of the control capacitor and from which a current can be generated as a function of a comparison of the incoming current signal with a predetermined current value; and
an oscillator with an oscillator output to emit an oscillator signal at a driver signal input of the driver circuit as a function of the control signal,
wherein the oscillator is a voltage-controlled oscillator and the control signal is a voltage signal.

13. A circuit arrangement for a piezo transformer, comprising:
a driver circuit adapted to be coupled to the piezo transformer;
a current sensor that is configured to generate an incoming current signal as a function of an incoming current flowing through the piezo transformer;
a control unit configured to generate a control signal in such a way that the incoming current signal is equal to a predetermined current value; and
an oscillator with an oscillator output to emit an oscillator signal at a driver signal input of the driver circuit as a function of the control signal,
wherein the control signal influences a frequency of the oscillator signal and the oscillator provides the oscillating signal with an operating point frequency at which the incoming current signal is equal to the predetermined current value.

* * * * *

UNITED STATES PATENT AND TRADEMARK OFFICE
CERTIFICATE OF CORRECTION

PATENT NO. : 8,710,761 B2  
APPLICATION NO. : 13/310405  
DATED : April 29, 2014  
INVENTOR(S) : Manfred Pauritsch et al.

Page 1 of 1

It is certified that error appears in the above-identified patent and that said Letters Patent is hereby corrected as shown below:

TITLE PAGE:

(73) "Assignee"

Change "Unterpremstaetten (AU)" to --Unterpremstaetten (AT)--.

Signed and Sealed this
Twenty-fourth Day of February, 2015

Michelle K. Lee
*Deputy Director of the United States Patent and Trademark Office*